(12) United States Patent
Ishibashi

(10) Patent No.: US 6,696,713 B2
(45) Date of Patent: Feb. 24, 2004

(54) SEMICONDUCTOR MEMORY PROVIDED WITH VERTICAL TRANSISTOR AND METHOD OF MANUFACTURING THE SAME

(75) Inventor: Shigeru Ishibashi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/881,121

(22) Filed: Jun. 15, 2001

(65) Prior Publication Data

US 2001/0052614 A1 Dec. 20, 2001

(30) Foreign Application Priority Data

Jun. 16, 2000 (JP) .......................... 2000-181918

(51) Int. Cl.[7] .................. H01L 27/108; H01L 29/788

(52) U.S. Cl. ................. 257/296; 257/302; 257/298; 257/329; 257/300; 365/185.24

(58) Field of Search ................. 257/296, 302, 257/298, 329, 300; 365/185.24

(56) References Cited

U.S. PATENT DOCUMENTS 5,753,947 A 5/1998 Gonzalez

FOREIGN PATENT DOCUMENTS

| JP | 9-321296 | 12/1997 |
| JP | 2000-260785 | 9/2000 |

OTHER PUBLICATIONS

"A Surrounding Gate Transistor (SGT) Cell for 64/256 Mbit DRAMS", K. Sunouchi, et al., IEDM 89–23, pp. 2.1.1–2.1.4.

Primary Examiner—George Eckert
Assistant Examiner—Joseph Nguyen
(74) Attorney, Agent, or Firm—Banner & Witcoff, Ltd.

(57) ABSTRACT

There is proposed a vertical cell transfer transistor comprising a channel region constituted by a monocrystalline silicon layer which is formed by way of epitaxial growth, source-drain regions constituted by n-type diffusion regions which are formed over and below the monocrystalline silicon layer, and an embedded type gate electrode constituted by a word line. In this case, the surface of the insulating film is made flush with the top surface of the n-type diffusion region, i.e. substantially flat and hence free from a stepped portion.

12 Claims, 15 Drawing Sheets

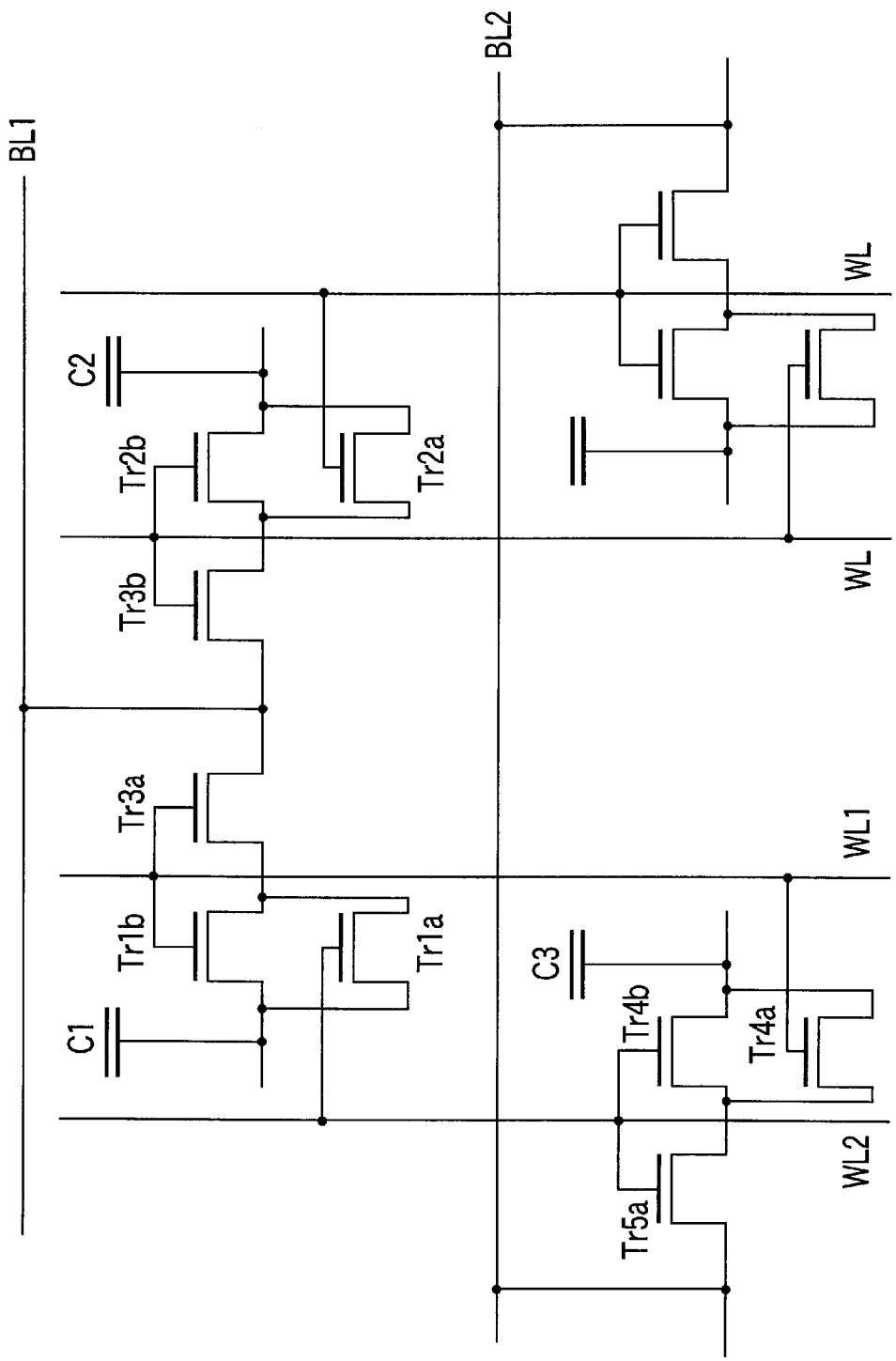
F I G. 14

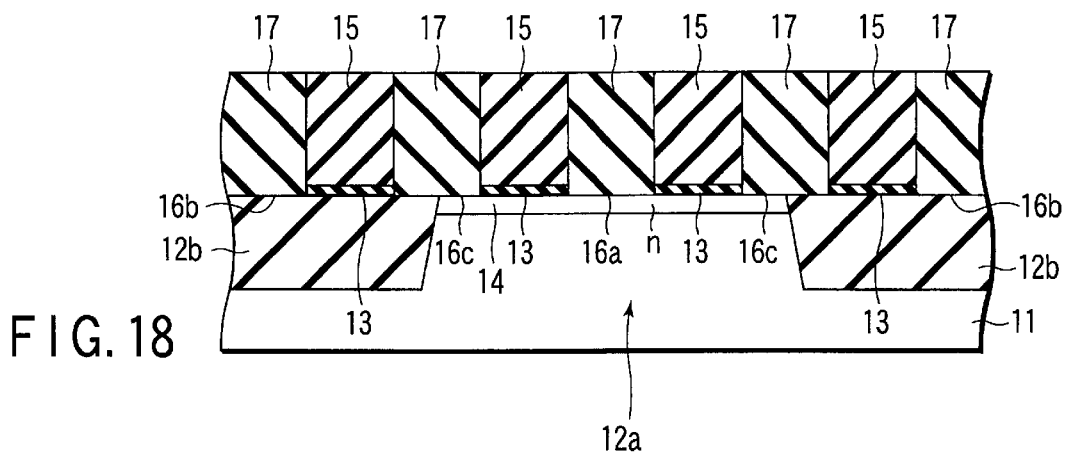
F I G. 18
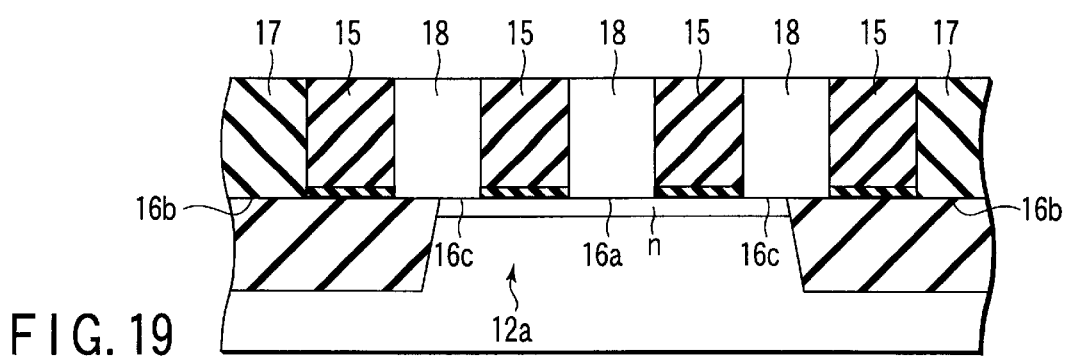
F I G. 19
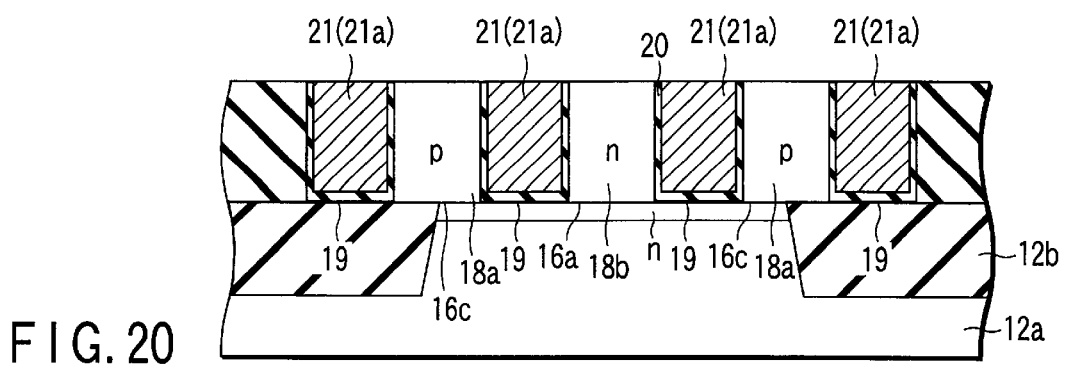
F I G. 20
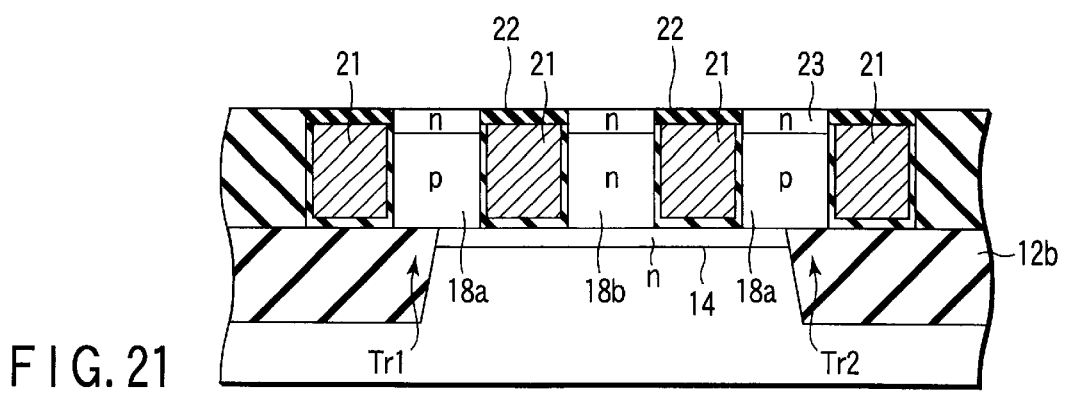
F I G. 21

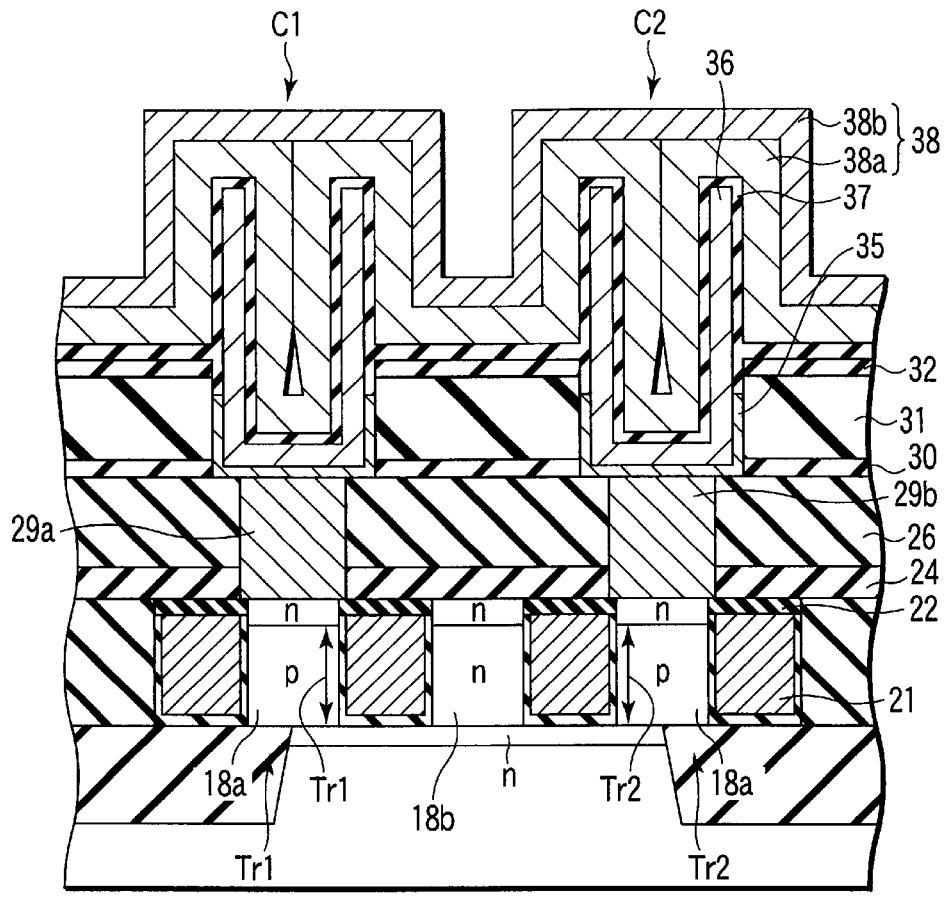
F I G. 22A
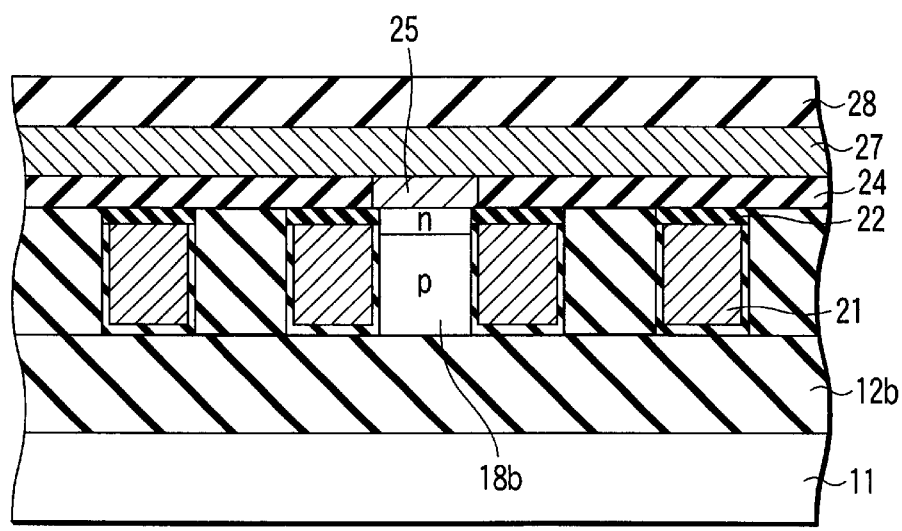
F I G. 22B

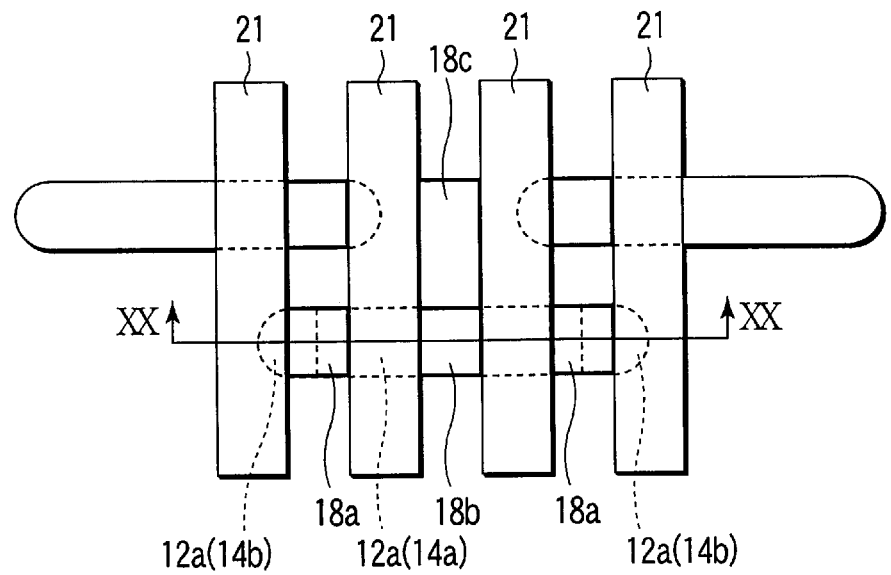
F I G. 23A
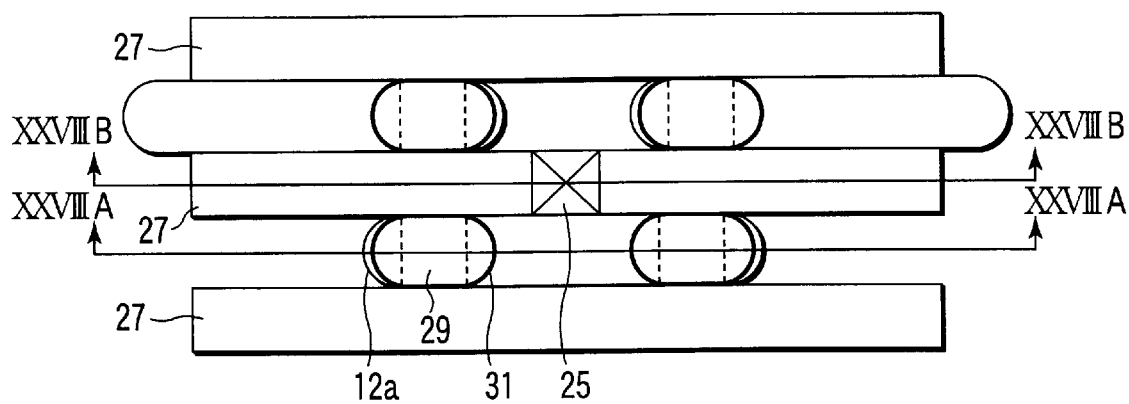
F I G. 23B

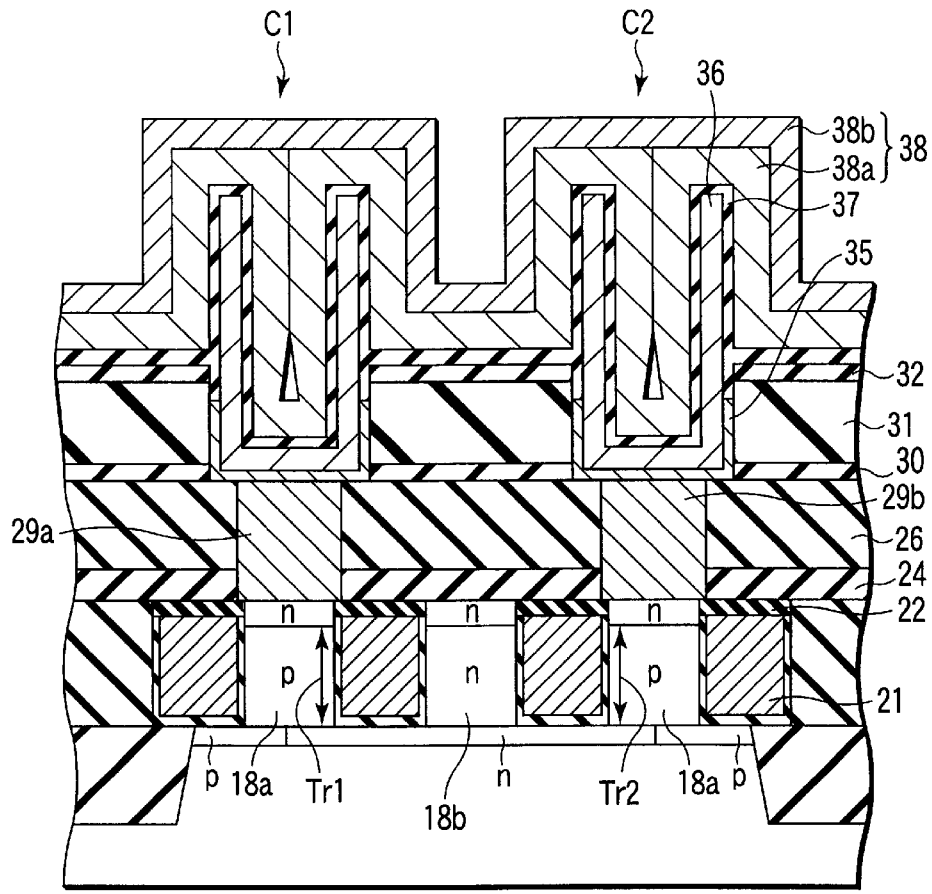
F I G. 28A
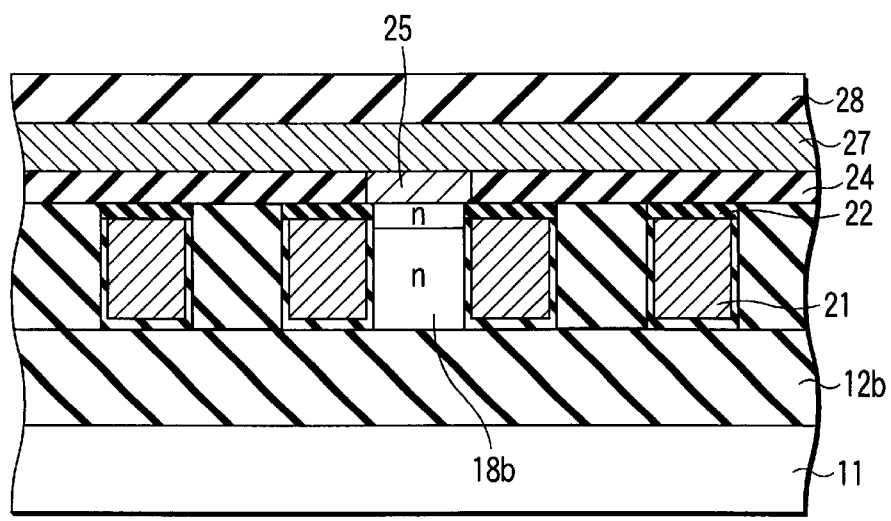
F I G. 28B

SEMICONDUCTOR MEMORY PROVIDED WITH VERTICAL TRANSISTOR AND METHOD OF MANUFACTURING THE SAME

CROSS-REFERENCE TO RELATED APPLICATIONS

This application is based upon and claims the benefit of priority from the prior Japanese Patent Application No. 2000-181918, filed Jun. 16, 2000, the entire contents of which are incorporated herein by reference.

BACKGROUND OF THE INVENTION

This invention relates to a cell transfer transistor of a DRAM, in particular, to a semiconductor memory provided with a vertical transistor and the method of manufacturing the same.

In the case of a cell transfer gate transistor of a DRAM having a stacked capacitor, in conformity with the miniaturization of the design rule, it is required to reduce the gate length in a manner equivalent to the minimum design rule. On this occasion, the threshold value of the cell transfer transistor is required to be kept substantially constant in view of the leak current to be generated when the transistor is in the state of OFF. On the other hand, in order to enable the threshold value of the cell transfer transistor to be kept constant, the concentration of the channel region impurity is required to be increased taking the short channel effects thereof into consideration. However, when the concentration of the channel region impurity is increased, it will lead to an increase of junction leak as well as to the deterioration of pose characteristics.

It is necessary, in order to suppress these phenomena, to employ a vertical transistor in place of the conventional planar transistor, thereby separating the gate length of the cell transfer transistor away from the minimum design rule. As one example of the vertical transistor, there is proposed "A Surrounding Gate Transistor (SGT) Cell for 64/256 Mbit DRAM" which is set forth on pages 23 through 26 of International Electron Device Meeting (IEDM) 1989 Technical Digest.

However, the memory cell constituted by the conventional vertical transistor has been manufactured in such a way that a silicon substrate is etched to form silicon columns, and transfer gates are formed around this silicon column. As a result, the manufacturing process thereof is relatively complicated, thus increasing the manufacturing cost thereof.

BRIEF SUMMARY OF THE INVENTION

The present inventor has been accomplished in view of the aforementioned problems, and therefore, an object of this invention is to provide a semiconductor memory which is simply manufactured, and can be manufactured at low cost. Another object of this invention is to provide a method of manufacturing such a semiconductor memory.

Namely, according to a first aspect of this invention, there is provided a semiconductor memory which comprises:

an element isolation region constituted by an element isolating insulation film and selectively formed in a semiconductor substrate, thereby isolating an element region by the element isolation region;

a first diffusion region of a first conductivity type, which is formed on a surface of the element region;

a plurality of electrodes formed selectively on a surface of the semiconductor substrate;

a gate insulating film formed on the side wall and bottom face of the electrodes;

a monocrystalline silicon layer of a second conductivity type which is located between the electrodes, opposite sidewalls of the monocrystalline silicon layer being contacted with the gate insulating film, and a bottom face of the monocrystalline silicon layer being contacted with the first diffusion region;

a second diffusion region of a first conductivity type, which is formed on a surface of the monocrystalline silicon layer; and an insulating film formed on the electrodes, a top surface of the insulating film being flush with a top surface of the second diffusion region.

According to a second aspect of this invention, there is provided a semiconductor memory which comprises:

an element isolation region constituted by an element isolating insulation film and selectively formed in a semiconductor substrate, thereby isolating an element region by the element isolation region;

a first diffusion region of a first conductivity type, which is formed on a surface of the element region;

a plurality of electrodes formed selectively on a surface of the semiconductor substrate;

a gate insulating film formed on the side wall and bottom face of the electrodes;

a first monocrystalline silicon layer of a first conductivity type which is located between the electrodes, opposite sidewalls of the first monocrystalline silicon layer being contacted with the gate insulating film, and a bottom face of the first monocrystalline silicon layer being contacted with the first diffusion region;

a second monocrystalline silicon layer of a second conductivity type which is located between the electrodes, opposite sidewalls of the second monocrystalline silicon layer being contacted with the gate insulating film, and a bottom face of the second monocrystalline silicon layer being contacted with the first diffusion region and with the element isolation region;

a second diffusion region of a first conductivity type, which is formed on a surface of each of the first and second monocrystalline silicon layers; and an insulating film formed on the electrodes, a top surface of the insulating film being flush with a top surface of the second diffusion region.

According to a third aspect of this invention, there is provided a semiconductor memory which comprises:

an element isolation region constituted by an element isolating insulation film and selectively formed in a semiconductor substrate, thereby isolating an element region by the element isolation region;

a first diffusion region of a first conductivity type, which is formed on a surface of the element region;

a third diffusion region of a second conductivity type, which is formed on a surface of the element region, the third diffusion region being contacted with the first diffusion region and with the element isolation region;

a plurality of electrodes formed selectively on a surface of the semiconductor substrate;

a gate insulating film formed on the side wall and bottom face of the electrodes;

a first monocrystalline silicon layer of a first conductivity type which is located between the electrodes, opposite sidewalls of the first monocrystalline silicon layer being contacted with the gate insulating film, and a bottom face of the first monocrystalline silicon layer being contacted with the first diffusion region;

a second monocrystalline silicon layer of a second conductivity type which is located between the electrodes, opposite sidewalls of the second monocrystalline silicon layer being contacted with the gate insulating film, and a bottom face of the second monocrystalline silicon layer being contacted with the first diffusion region and with the third diffusion region;

a second diffusion region of a first conductivity type, which is formed on a surface of each of the first and second monocrystalline silicon layers; and an insulating film formed on the electrodes, a top surface of the insulating film being flush with a top surface of the second diffusion region.

It is preferable, with semiconductor memories according to the aforementioned first and third aspects of this invention, to dispose the bottom face of the second diffusion region at a place which is lower than the bottom face of the insulating film.

In the semiconductor memory according to the first aspect of this invention, it may further comprise a storage node contact connected electrically with the second diffusion region; a capacitor connected electrically with the storage node contact; a bit line contact connected electrically with a portion of the second diffusion region other than the portion thereof which is electrically connected with the storage node contact; and a bit line connected electrically with the bit line contact.

On the other hand, in the semiconductor memory according to each of the second and third aspects of this invention, it may further comprise a storage node contact connected electrically with the second diffusion region formed on the surface of the second monocrystalline silicon layer; a capacitor connected electrically with the storage node contact; a bit line contact connected electrically with the second diffusion region formed on the surface of the first monocrystalline silicon layer; and a bit line connected electrically with the bit line contact.

According to a fourth aspect of this invention, there is provided a method of manufacturing a semiconductor memory which comprises:

selectively forming an element isolation region constituted by an element isolating insulation film in a semiconductor substrate, thereby isolating an element region by the element isolation region;

forming a sacrificial insulating film on a surface of the semiconductor substrate;

forming a first diffusion region of a first conductivity type on a surface of the element region;

forming a dummy layer on a surface of the sacrificial insulating film;

selectively etching the dummy layer to thereby form a first recessed portion exposing the surface of the element region and a second recessed portion exposing the surface of the element isolation region;

forming an interlayer insulating film in each of the first and second recessed portions;

removing the interlayer insulating film from the first recessed portion, thereby permitting the surface of the element region to be exposed;

forming a monocrystalline silicon layer of a second conductivity type in the first recessed portion by means of epitaxial growth;

removing the dummy layer to form a groove to thereby permit sidewalls of the monocrystalline silicon layer and a top surface of the element region to be exposed through the groove;

forming a gate insulating film on the exposed sidewalls of the monocrystalline silicon layer as well as on the exposed top surface of the element region;

forming a gate electrode in the groove;

removing an upper surface portion of the gate electrode;

forming an insulation film on a surface of the gate electrode where the top surface is removed; and forming a second diffusion region of a first conductivity type on a surface of the monocrystalline silicon layer.

According to a fifth aspect of this invention, there is also provided a method of manufacturing a semiconductor memory which comprises the steps of:

selectively forming an element isolation region constituted by an element isolating insulation film in a semiconductor substrate, thereby isolating an element region by the element isolation region;

forming a sacrificial insulating film on a surface of the semiconductor substrate;

forming a first diffusion region of a first conductivity type on a surface of the element region;

forming a dummy layer on a surface of the sacrificial insulating film;

selectively etching the dummy layer to thereby form a first recessed portion exposing the surface of the element region, a second recessed portion exposing the surface of the element isolation region, and a third recessed portion exposing the surfaces of the element region and of the element isolation region;

forming an interlayer insulating film in each of the first, second and third recessed portions;

removing the interlayer insulating film from the first and third recessed portions, thereby permitting the surface of the element region to be exposed;

forming a first monocrystalline silicon layer in the first and third recessed portions by means of epitaxial growth;

removing the dummy layer to form a groove to thereby permit sidewalls of the first monocrystalline silicon layer and a top surface of the element region to be exposed through the groove;

forming a gate insulating film on the exposed sidewalls of the first monocrystalline silicon layer as well as on the exposed top surface of the element region;

forming a gate electrode in the groove;

performing an ion implantation of the first monocrystalline silicon layer, thereby forming a second monocrystalline silicon layer of a first conductivity type in the first recessed portion and also forming a third monocrystalline silicon layer of a second conductivity type in the third recessed portion;

removing an upper surface portion of the gate electrode;

forming an insulation film on a surface of the gate electrode where the top surface is removed; and forming a second diffusion region of a first conductivity type on the surfaces of the second and third monocrystalline silicon layers.

According to a sixth aspect of this invention, there is also provided a method of manufacturing a semiconductor memory which comprises:

selectively forming an element isolation region constituted by an element isolating insulation film in a semiconductor substrate, thereby isolating an element region by the element isolation region;

forming a sacrificial insulating film on a surface of the semiconductor substrate;

forming a first diffusion region of a first conductivity type on a surface of the element region, thereby forming a second diffusion region of a second conductivity type at a surface region of the element region which neighbors on the element isolation region and on the first diffusion region;

forming a dummy layer on a surface of the sacrificial insulating film;

selectively etching the dummy layer to thereby form a first recessed portion exposing the surface of the first diffusion region, a second recessed portion exposing the surface of the element isolation region, and a third recessed portion exposing the surfaces of the first and second diffusion regions;

forming an interlayer insulating film in each of the first, second and third recessed portions;

removing the interlayer insulating film from the first and third recessed portions, thereby permitting the surface of the element region to be exposed;

forming a first monocrystalline silicon layer in the first and third recessed portions by means of epitaxial growth;

removing the dummy layer to form a groove to thereby permit sidewalls of the first monocrystalline silicon layer and a top surface of the element region to be exposed through the groove;

forming a gate insulating film on the exposed sidewalls of the first monocrystalline silicon layer as well as on the exposed top surface of the element region;

forming a gate electrode in the groove;

performing an ion implantation of the first monocrystalline silicon layer, thereby forming a second monocrystalline silicon layer of a first conductivity type in the first recessed portion and also forming a third monocrystalline silicon layer of a second conductivity type in the third recessed portion;

removing an upper surface portion of the gate electrode;

forming an insulation film on a surface of the gate electrode where the top surface is removed; and forming a third diffusion region of a first conductivity type on the surfaces of the second and third monocrystalline silicon layers.

It is preferable, in the method of manufacturing a semiconductor memory according to the fourth, fifth and sixth aspects of this invention, that the film thickness of the sacrificial insulating film at the time of forming it should be made larger than the film thickness of the gate insulating film.

In the method of manufacturing a semiconductor memory according to the fourth, fifth and sixth aspects of this invention, the gate insulating film may be formed through the oxidation of the exposed sidewall of the monocrystalline silicon layer. Alternatively, the gate insulating film may be formed by way of the deposition of a high-melting point metal film.

The method of manufacturing a semiconductor memory according to the fourth aspect of this invention may further comprise, subsequent to the step of forming the monocrystalline silicon layer up to the level of the surface of the dummy layer by way of a selective epitaxial growth, a step of forming a polycrystalline silicon film on the aforementioned interlayer insulating film by way of non-selective epitaxial growth.

The methods of manufacturing a semiconductor memory according to the fifth and sixth aspects of this invention may further comprise, subsequent to the step of forming the first monocrystalline silicon layer up to the level of the surface of the dummy layer by way of a selective epitaxial growth, a step of forming a polycrystalline silicon film on the aforementioned interlayer insulating film by way of non-selective epitaxial growth.

As explained above, according to this invention, it is possible to provide a semiconductor memory and the method of manufacturing the same, which make it possible to simplify the manufacturing steps and to reduce the manufacturing cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 14 is a graph of an equivalent circuit of the semiconductor memory according to a first embodiment of this invention;

FIGS. 18, 19, 20, 21, 22A and 22B show cross-sectional views illustrating the manufacturing steps of a semiconductor memory according to a third embodiment of this invention;

FIGS. 23A and 23B are plan views of the semiconductor memory according to a fourth embodiment of this invention; and FIGS. 24, 25, 26, 27, 28A and 28B are cross-sectional views illustrating the manufacturing steps of a semiconductor memory according to a fourth embodiment of this invention.

DETAILED DESCRIPTION OF THE INVENTION

Figure 1A:
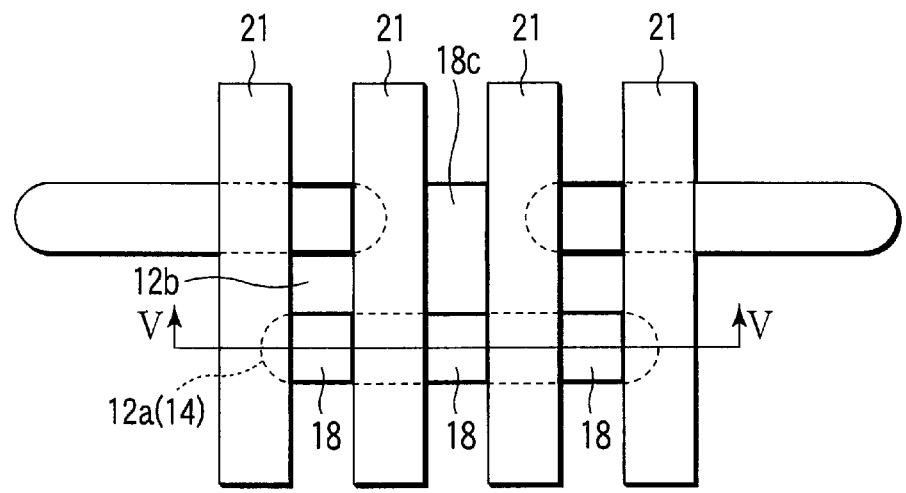
FIGS. 1A and 1B show a plan view of the semiconductor memory according to a first embodiment of this invention.

Next, specific embodiments of this invention will be explained with reference to the drawings attached herewith, wherein the same portions or components common to these drawings are identified by the same reference numerals.

A First Embodiment

This first embodiment is featured in that a monocrystalline silicon layer is formed through an epitaxial growth on the surface of a semiconductor substrate, and that this monocrystalline silicon layer is employed as a channel region of a cell transfer transistor.

Figure 1B:
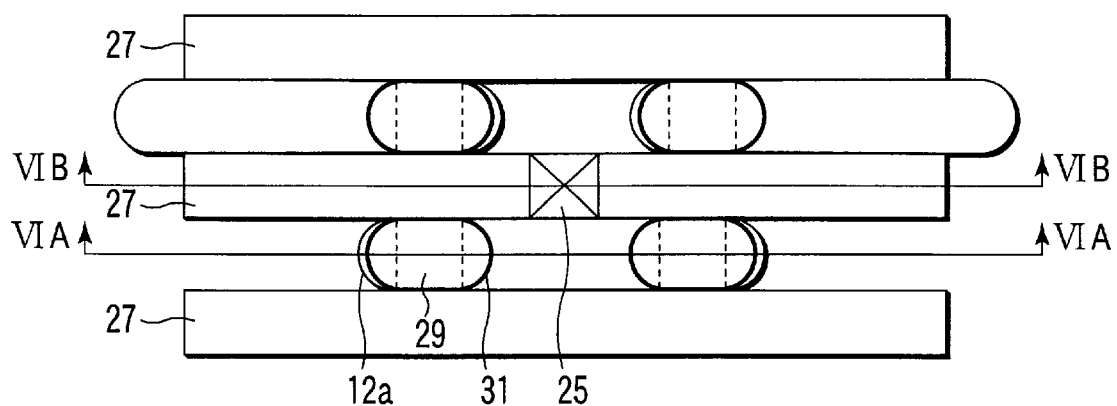

FIGS. 1A and 1B are plan views of the semiconductor memory according to this first embodiment. More specifically, FIG. 1A shows the positional relationship among an element region 12a (n-type diffusion region 14), an STI 12b, a word line 21, a monocrystalline silicon layer 18 and a polycrystalline silicon layer 18c. Whereas, FIG. 1B shows the positional relationship among the element region 12a, a bit line contact 25, a bit line 27, a storage node contact 29 and storage node 31. Incidentally, the word line 21 is omitted in FIG. 1B.

FIG. 2 through FIG. 13 are cross-sectional views of a semiconductor memory taken along the line V—V of FIG. 1. More specifically, FIG. 6A shows a cross-sectional view of the semiconductor memory taken along the line VIA—VIA of FIG. 1B. Whereas, FIG. 6B shows a cross-sectional view of the semiconductor memory taken along the line VIB—VIB of FIG. 1B. Next, the manufacturing method of a semiconductor memory according to the first embodiment will be explained.

Figure 2:
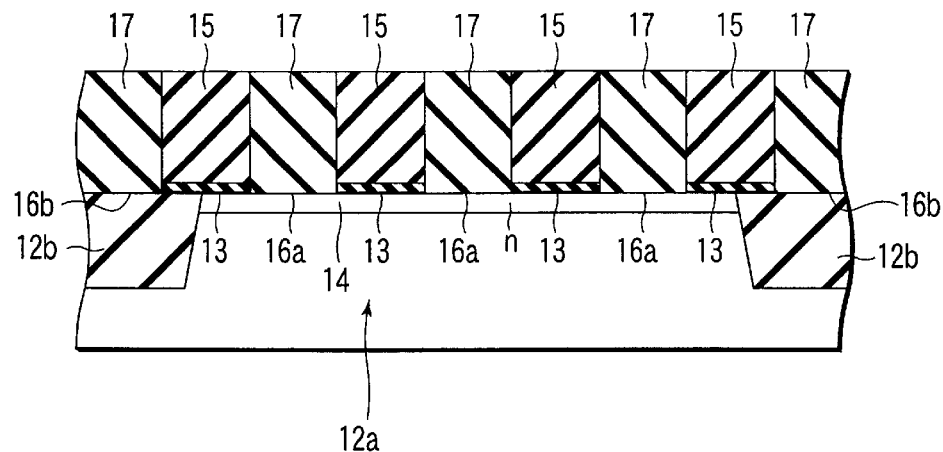
FIGS. 2, 3, 4, 5, 6A, 6B, 7, 8, 9, 10, 11, 12 and 13 are cross-sectional views illustrating the manufacturing steps of a semiconductor memory according to a first embodiment of this invention.

First of all, as shown in FIG. 2, an element isolation region (hereinafter referred to as STI) 12b constituted by an element isolation insulating film of STI (Shallow Trench Isolation) structure is selectively formed in a semiconductor substrate (silicon substrate) 11, thereby isolating the element region 12a. Thereafter, a sacrificial oxide film 13 is formed on the semiconductor substrate 11. This sacrificial oxide film 13 is allowed to remain even after the formation of the word line 21 so as to make it function as an insulating film between the word line 21 and the semiconductor substrate 11. Therefore, in order to minimize the capacity of the word line 21, the film thickness of the sacrificial oxide film 13 should preferably be larger than the film thickness of the gate insulating film 20 as described hereinafter.

If the cell transfer transistor is of N-channel for instance, a p-type diffusion region is usually formed, for the purpose of forming a channel region, in the surface region of the element region 12a. In this embodiment however, source/drain regions are formed in the aforementioned surface region. Accordingly, an ion implantation is performed so as to turn the surface of the element region 12a into an n-type region. As a result, an n-type diffusion region 14 for forming a source region of the cell transfer transistor is formed in the surface region of the element region 12a.

Next, a nitride film (hereinafter referred to as a dummy layer) 15 to be utilized as a dummy word line is formed on the sacrificial oxide film 13. Then, a resist (not shown) is coated on this dummy layer 15 and subsequently etched by means of lithography so as to make it into a desired word line pattern. This patterned resist is then employed as a mask to selectively etch the dummy layer 15 by means of RIE (Reactive Ion Etching). As a result, a first recessed portion 16a exposing the surface of the element region 12a is formed concurrent with the formation of a second recessed portion 16b exposing the surface of the STI 12b. Subsequently, the resist is removed.

Thereafter, the ion implantation of the source/drain regions (not shown) in the peripheral circuit region is performed, and then, an interlayer insulating film 17 constituted by BPSG (Boron Phosphorous Silicate Glass) is formed on the dummy layer 15 as well as in the first and second recessed portions 16a and 16b, thereby filling the first and second recessed portions 16a and 16b with the interlayer insulating film 17. Subsequently, by means of CMP (Chemical Mechanical Polish), the interlayer insulating film 17 is flattened until the surface of the dummy layer 15 is exposed.

Figure 3:
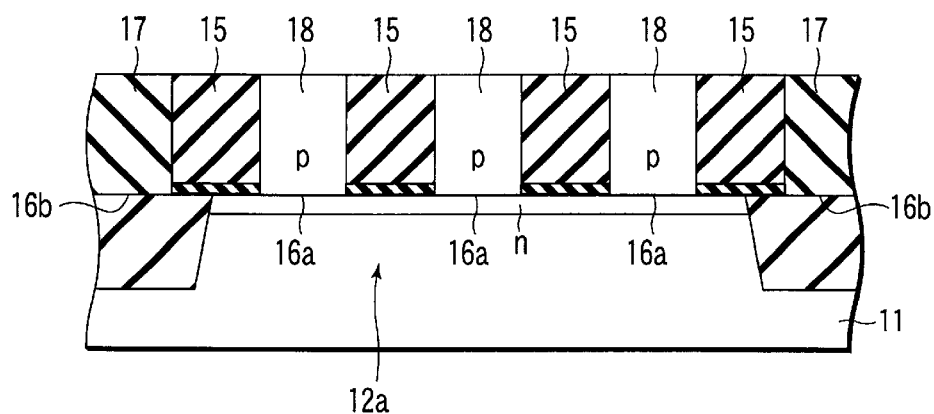

Next, as shown in FIG. 3, by means of lithography and etching, the interlayer insulating film 17 placed in the first recessed portion 16a is removed, thereby exposing the surface of the element region 12a. Thereafter, a p-type silicon containing an impurity such as boron is epitaxially grown on the exposed surface of the element region 12a. As a result, a monocrystalline silicon layer 18 is formed in the first recessed portion 16a. The epitaxial growth on this occasion should be executed so as to allow the monocrystalline silicon layer 18 to be formed selectively only on the silicon substrate. At the moment when the height of the monocrystalline silicon layer 18 becomes higher than the level of the surface of the dummy layer 15, the crystal growth is switched from the aforementioned selective growth to a non-selective growth, thereby allowing polycrystalline silicon layer (not shown) to be deposited on the interlayer insulating film 17. Thereafter, by means of CMP, the flattening of the monocrystalline silicon layer 18 and of the polycrystalline silicon layer is performed until the surface of the dummy layer 15 is exposed.

As a result of these procedures described above, the monocrystalline silicon layer 18 is enabled to be formed only in the first recessed portion 16a formed on the element region 12a. Further, as shown in FIG. 1A, the polycrystalline silicon layer 18c is left remained over part of the STI 12b. This polycrystalline silicon layer 18c left remained in this manner is utilized subsequently as a bit line lead-out portion for connecting a bit line contact 25 with the cell transfer transistor as described hereinafter. Incidentally, since any recessed portion is not formed in the peripheral circuit region, there is no possibility that the silicon layer remains on the substrate 11 after the silicon layer has been flattened by means of the CMP.

Figure 4:
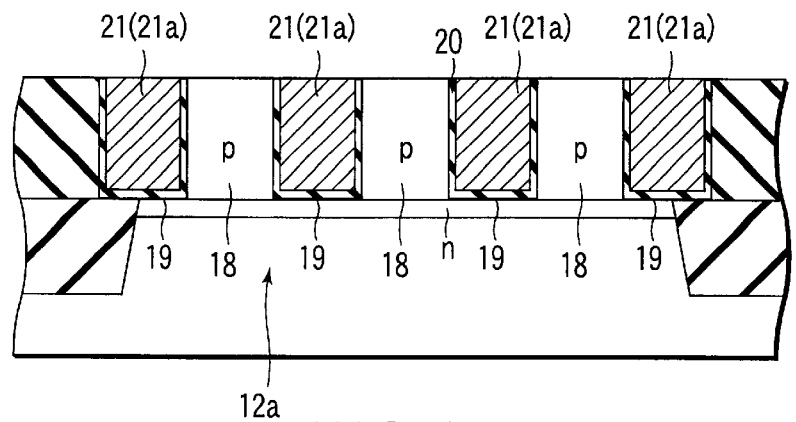

Next, as shown in FIG. 4, by making use of hydrofluoric acid and glycerol, the dummy layer 15 is removed to thereby form a groove 19. The sidewall of the monocrystalline silicon layer 18 and the top surface of the element region 12a that have been exposed due to the formation of this groove 19 are oxidized, thereby enabling a gate insulating film 20 to be formed on the sidewall and bottom face of the groove 19. Thereafter, the groove 19 is filled with a gate electrode material, e.g. a metallic material 21a such as polycrystalline silicon or tungsten. Then, the metallic material 21a is flattened by means of CMP until the surface of the monocrystalline silicon layer 18 is exposed, thereby forming the word line 21 in the groove 19.

Figure 5:
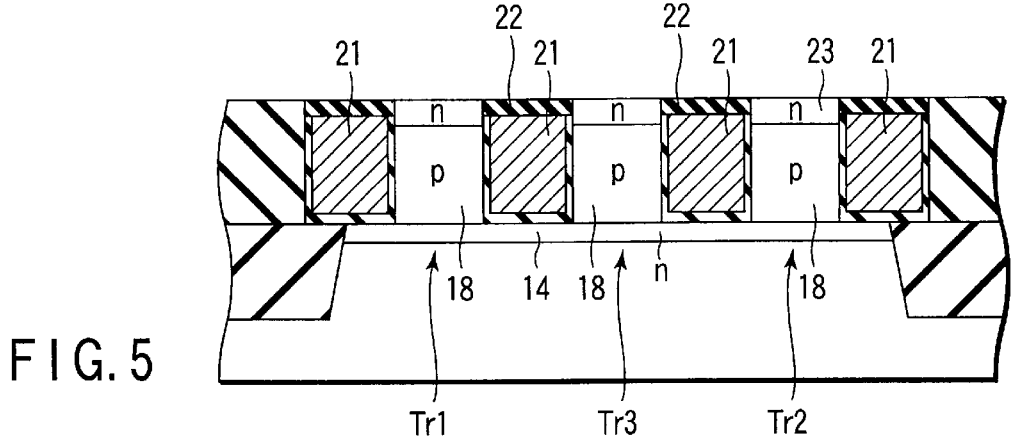

Then, as shown in FIG. 5, by way of a recessing treatment employing RIE, only an upper surface portion of the word line 21 is removed. As a result, since the top surface of the word line 21 becomes lower than the level of the peripheral layers including the monocrystalline silicon layer 18, the alignment of storage node contacts 29a and 29b (to be described hereinafter) on the occasion of forming them can be facilitated. Thereafter, an insulating film 22 constituted by an oxide film or a nitride film, for example TEOS (Tetra Ethyl Ortho Silicate), is formed on the surface of the word line 21 whose upper surface portion has been etched away as well as on the surface of the monocrystalline silicon layer 18. Subsequently, the flattening of the insulating film 22 is performed by means of CMP until the surface of the monocrystalline silicon layer 18 is exposed. As a result, the insulating film 22 remains only on an upper surface portion of the word line 21.

Next, an impurity such as phosphorus or arsenic is ion-implanted into the monocrystalline silicon layer 18 so as to turn the surface portion of the monocrystalline silicon layer 18 into an n-type region, thereby forming an n-type diffusion region 23 which is designed to be utilized as a drain of cell transfer transistor. In this case, for the purpose of preventing the development of an off-set state between the drain region and the transfer gate, it is desirable to form the n-type diffusion region 23 in such a manner that it extends deeper than the bottom face of the insulating film 22. Further, the top surface of the insulating film 22 is made flush with the top surface of the n-type diffusion region 23, thereby forming a flat surface free from any stepped portion.

In this manner, vertical cell transfer transistors Tr1, Tr2 and Tr3 can be formed, each transistor comprising a channel region constituted by the monocrystalline silicon layer 18, source-drain regions constituted by n-type diffusion regions 14 and 23 which are formed over and below the monocrystalline silicon layer 18, and an embedded type gate electrode constituted by the word line 21.

Figure 6A:
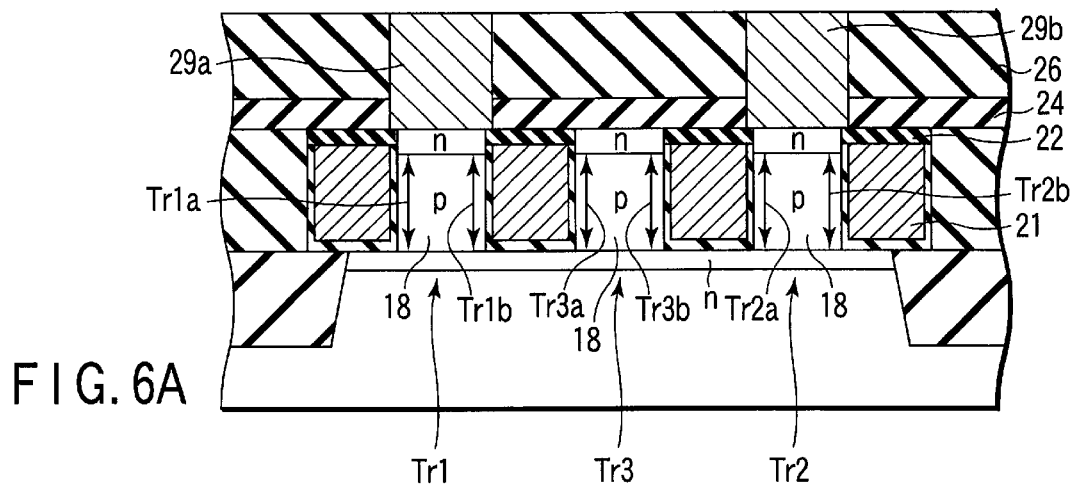
Figure 6B:
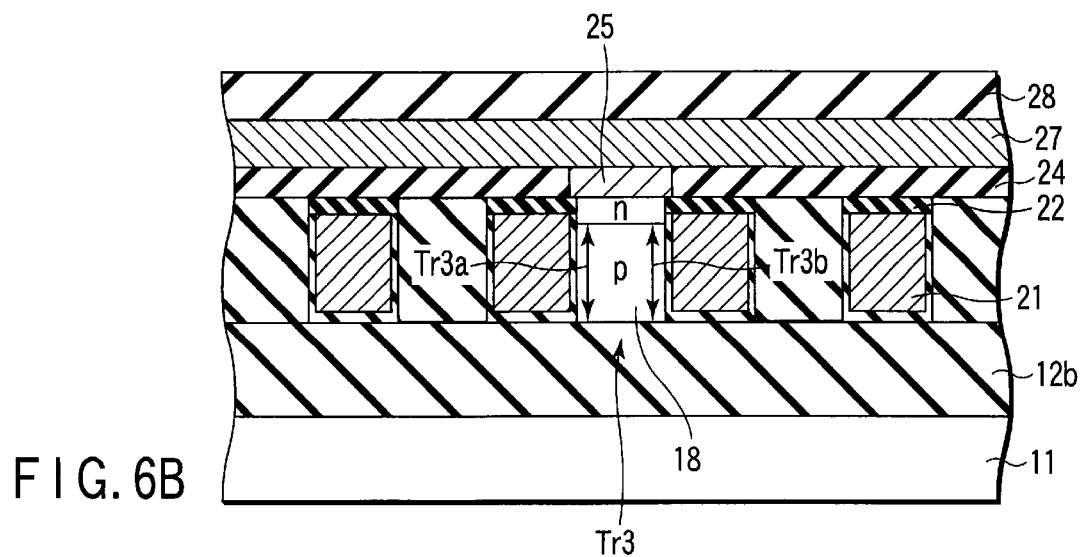

Next, as shown in FIGS. 6A and 6B, in the same manner as in the ordinary DRAM process, a bit line contact 25 to be connected with the cell transfer transistors Tr3 is formed in a bit line contact insulating film 24, and a bit line 27 is formed in an inter-bit line insulating film 26. Further, a bit line cap insulating film 28 is formed on this bit line 27. Thereafter, storage node contacts 29a and 29b connected respectively with the cell transfer transistors Tr1 and Tr2 are formed in the bit line contact insulating film 24 as well as in the inter-bit line insulating film 26.

Incidentally, if the insulating film 22 disposed on the word line 21 is formed of a nitride film, the etching can be performed in a self-alignment manner on the occasion of forming the bit line contact 25 and the storage node contacts 29a and 29b. On the other hand, if the insulating film 22 disposed on the word line 21 is formed of an oxide film, the etching to be employed on the occasion of forming the bit line contact 25 and the storage node contacts 29a and 29b should be adjusted in such a manner that even if the etching is proceeded to etch the monocrystalline silicon layer 18, the word line 21 is still kept away from the etching by taking advantage of the difference in height between the word line 21 and the monocrystalline silicon layer 18.

Figure 7:
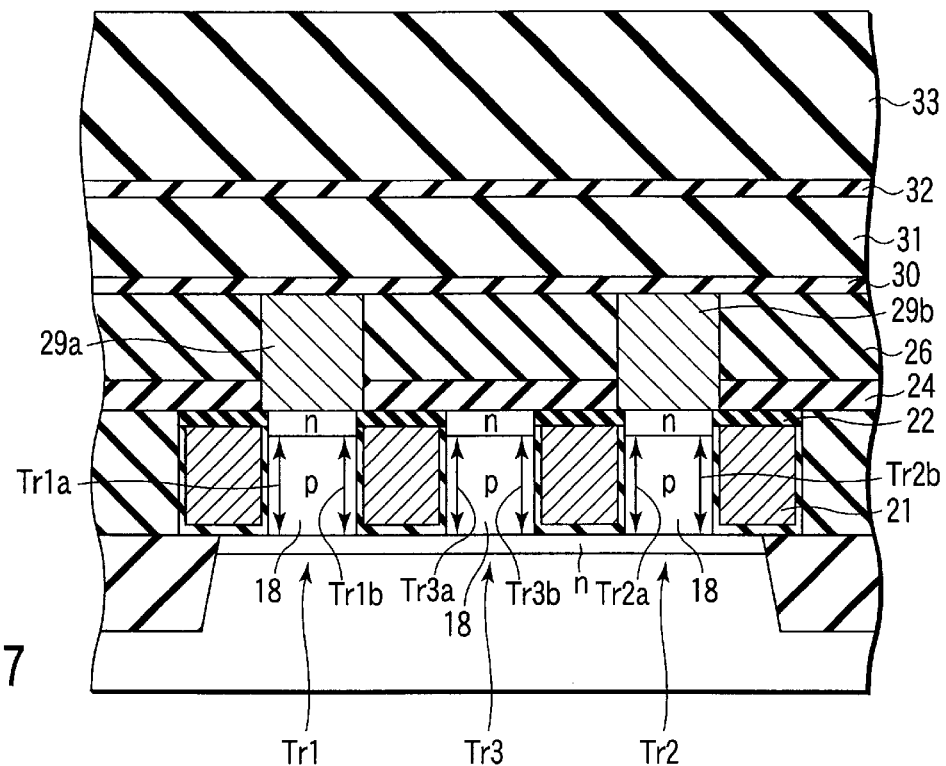

Next, as shown in FIG. 7, by means of CVD (Chemical Vapor Deposition), etc., a silicon nitride film 30, a silicon oxide film 31, a silicon nitride film 32 and a silicon oxide film 33 are successively deposited, each as an interlayer insulating film, on the inter-bit line insulating film 26 as well as on the storage node contacts 29a and 29b.

Figure 8:
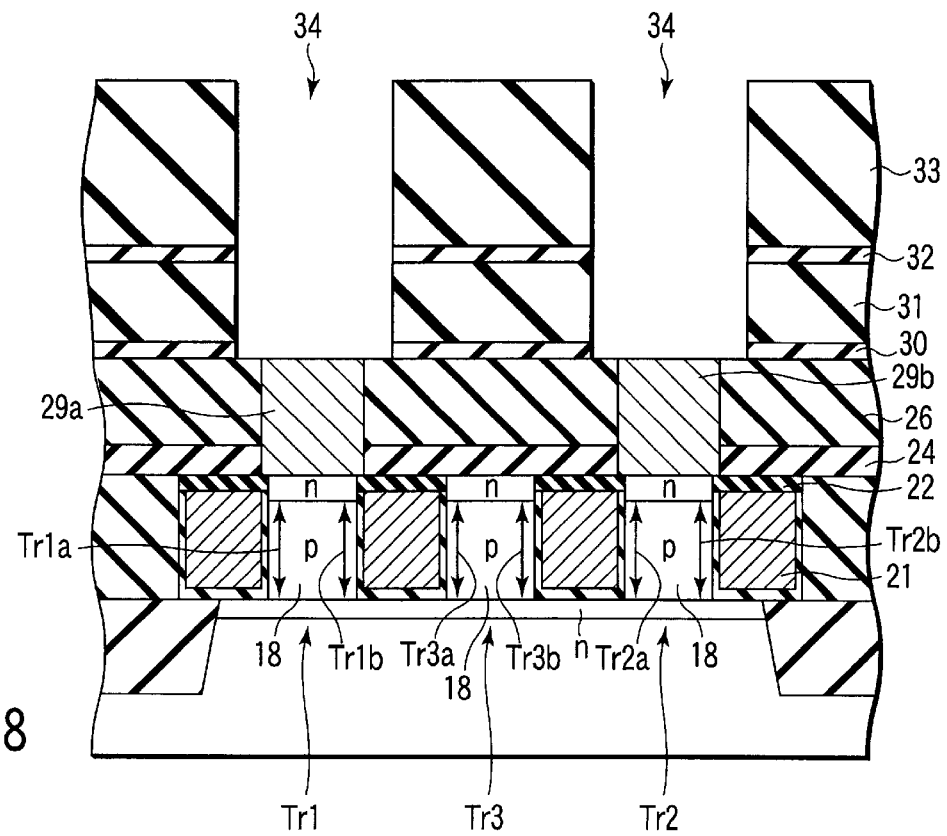

Then, as shown in FIG. 8, by making use of a lithographic technique and an isotropic etching technique, such as an RIE method, the silicon nitride films 30 and 32, and the silicon oxide films 31 and 33 are successively etched away to thereby form a groove 34. As a result, the top surfaces of the storage node contacts 29a and 29b are permitted to expose from the bottom of the groove 34.

Figure 9:
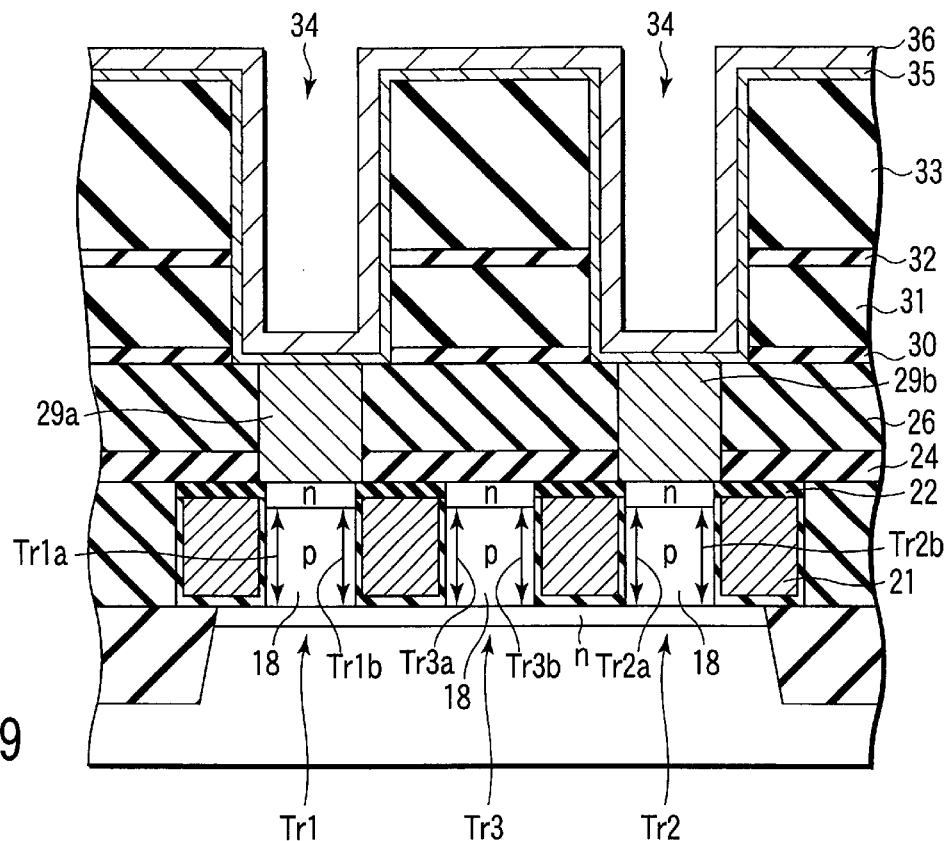

Next, as shown in FIG. 9, by means of CVD, etc., a liner 35 constituted by titanium nitride, etc. is formed on the surface of the silicon oxide film 33 and along the inner wall of groove 34. Then, a capacitor lower electrode 36 is formed by means of CVD, etc. on the surface of the liner 35. This capacitor lower electrode 36 can be formed by making use of a conductive film made of an element of platinum group such as ruthenium. Incidentally, this capacitor lower electrode 36 is designed to be utilized as a storage node electrode of a cell capacitor.

Figure 10:
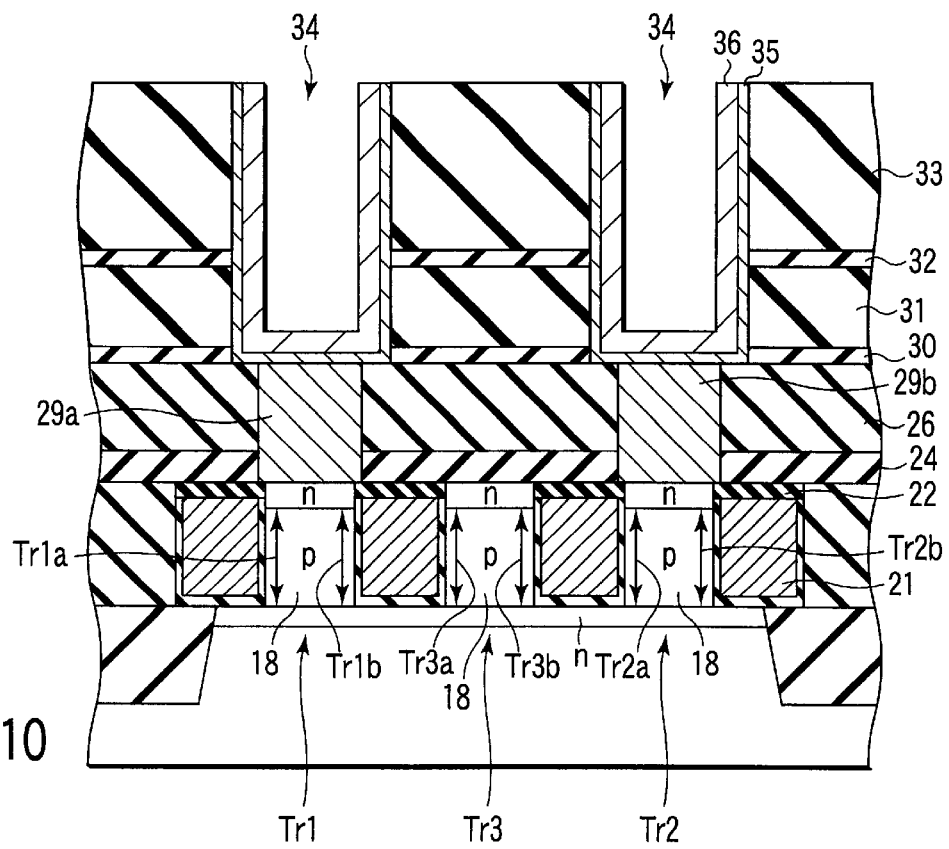

Next, as shown in FIG. 10, by means of CMP, etc., the liner 35 and capacitor lower electrode 36 both disposed over the silicon oxide film 33 are successively polished away. It is desirable on this occasion to fill the groove 34 with a resist (not shown) in advance for the purpose of protecting the capacitor lower electrode 36 disposed inside the groove 34. This resist can be removed by means of ashing after the polishing thereof by means of CMP method.

Figure 11:
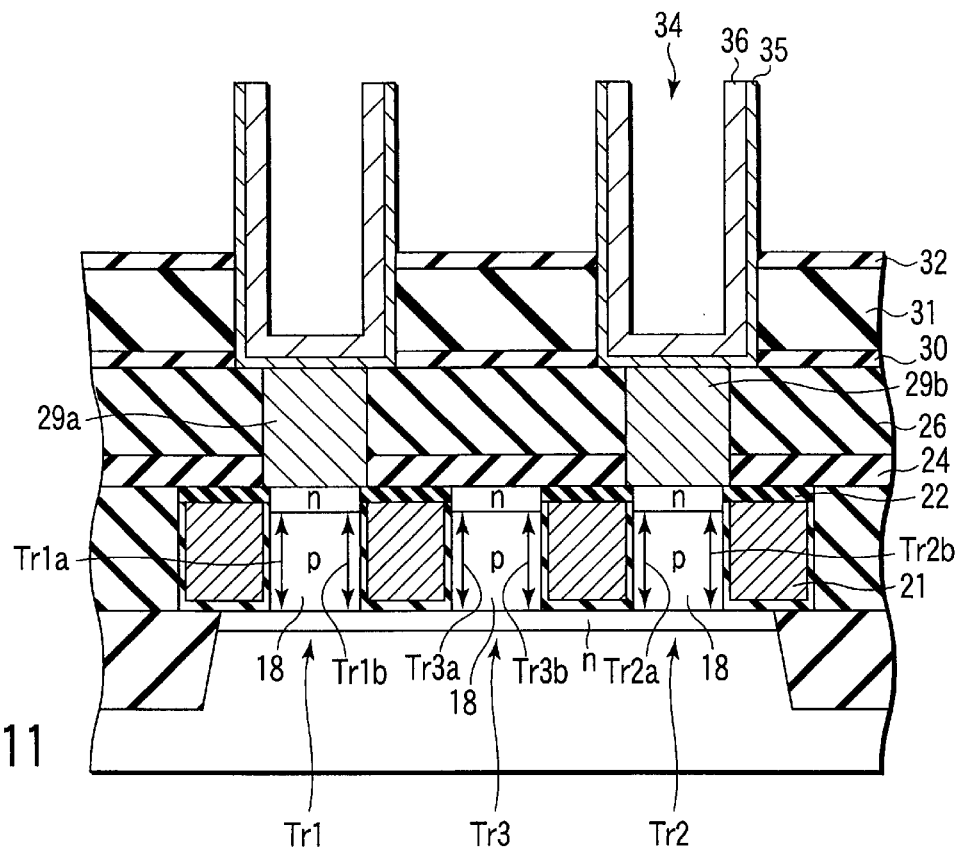

Thereafter, as shown in FIG. 11, a resist (not shown) is formed on the surfaces of the silicon oxide film 33, of the liner 35 and of the capacitor lower electrode 36, and is patterned in a manner to allow the resist to be left remained on the capacitor lower electrode 36. Thereafter, the silicon oxide film 33 is removed using this patterned resist as a mask.

Figure 12:
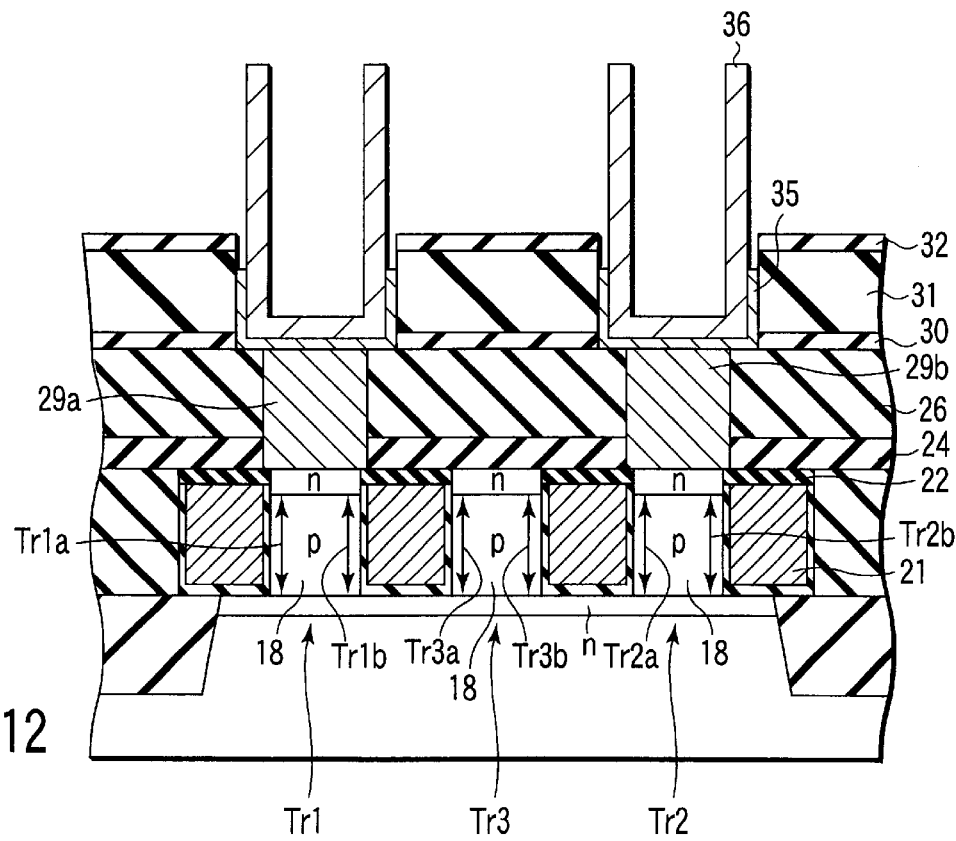

Then, as shown in FIG. 12, part of the liner 35 is removed by means of a wet etching method, etc. using a mixed solution comprising sulfuric acid and hydrogen peroxide and also using, as a mask, the same resist (not shown) as employed in the removal of the silicon oxide film 33. In this manner, a cell capacitor lower electrode of double-sized cylinder type which is separated one another by every bits can be accomplished.

Incidentally, it is necessary that on the occasion of etching the liner 35, the etching is performed in such a manner that the top surface of the liner 35 becomes lower than at least the top surface of the silicon nitride film 32.

Figure 13:
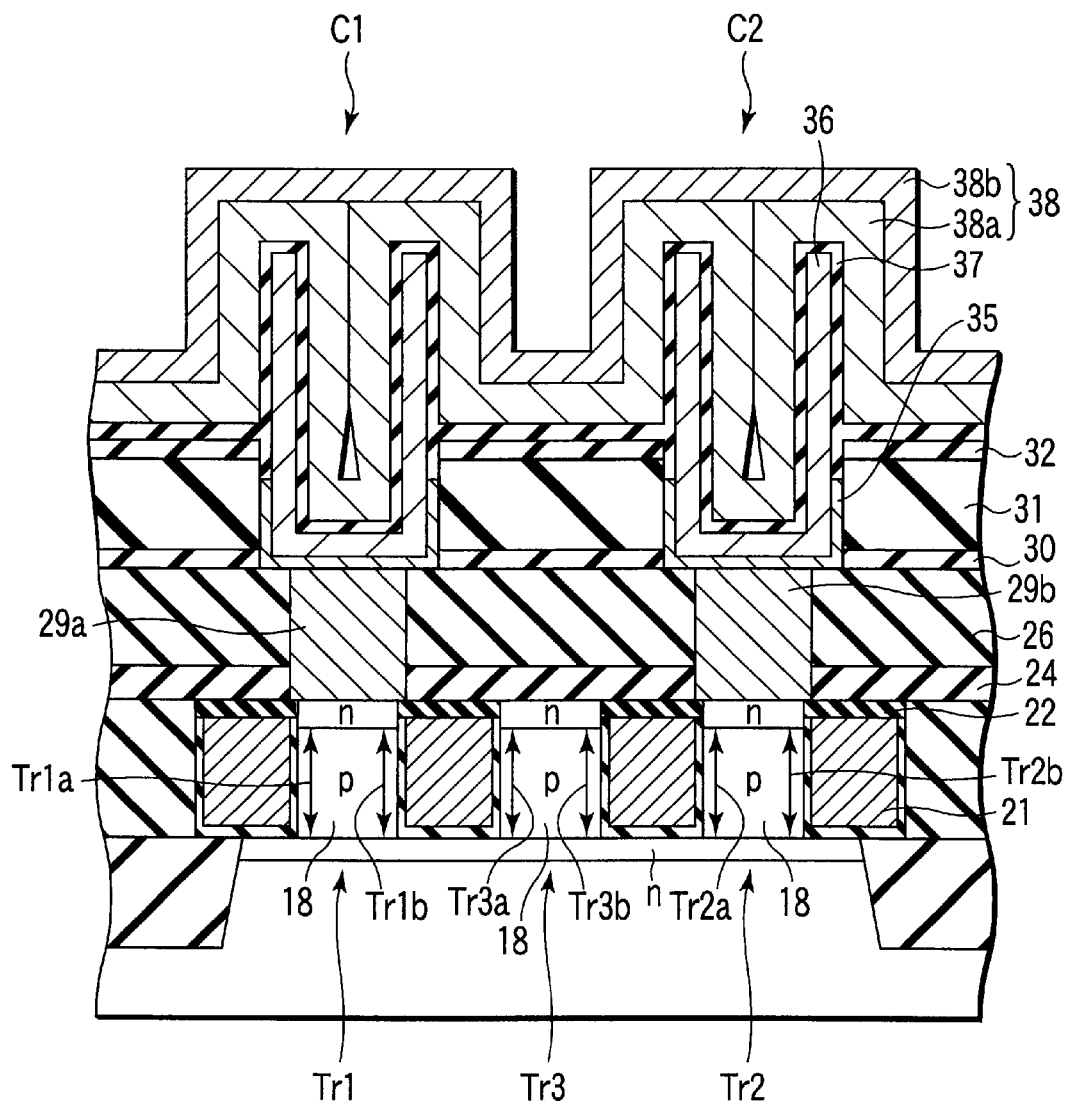

Then, as shown in FIG. 13, by means of CVD method, etc., a capacitor insulating film 37 is formed on the surfaces of the capacitor lower electrode 36, of the liner 35 and of the silicon nitride film 32. Incidentally, as for the material for the capacitor insulating film 37, it is preferable, for the purpose of securing a sufficient capacitance, to employ a ferroelectric film exhibiting a higher dielectric constant than that of the silicon oxide film, such as tantalum oxide film ($Ta_2O_5$). Then, by means of CVD method, etc., a capacitor upper electrode 38 constituted by a laminate structure consisting of a ruthenium film 38a and a titanium nitride film 38b is formed on the surface of the capacitor insulating film 37. Subsequently, by making use of lithographic technique and etching technique, the capacitor insulating film 37 and the capacitor upper electrode 38 are patterned into a desired pattern, thereby obtaining cell capacitors of a double-sized cylinder type C1 and C2.

FIG. 14 shows an equivalent circuit of the semiconductor memory according to the first embodiment of this invention. As shown in FIG. 14, in the case of the transistor Tr1b, one end of the current passageway thereof is connected with the capacitor C1, and the gate thereof is connected with the first word line WL1. In the case of the transistor Tr1a, the current passageway thereof is connected parallel with the transistor Tr1b, and the gate thereof is connected with the second word line WL2. In the case of the transistor Tr3a, one end of the current passageway thereof is connected with the other end of the current passageway of the transistor Tr1b, the gate thereof is connected with the first word line WL1, and the other end of the current passageway thereof is connected with the bit line BL1.

According to this equivalent circuit, when the word line WL1 is selected, for instance, on the occasion of reading out an electric charge from the capacitor C1, the electric charge stored in the capacitor C1 is discharged via the transistors Tr1a and Tr3a into the bit line BL1. On the other hand, when the word line WL2 is selected for instance, the electric charge stored in the capacitor C1 is discharged via the transistors Tr4b and Tr5a into the bit line BL2, instead of enabling it to be discharged via the transistors Tr1a and Tr3a into the bit line BL1.

Namely, if another cell transfer transistor Tr3 (connected in series with the storage node side) which is to be connected with the bit line contact 25 is not provided, the cell transfer transistors Tr1a and Tr1b which are connected with the storage node contact 29a are caused to execute the action thereof irrespective of which word line, WL1 or WL2, is selected. However, according to this first embodiment, since the cell transfer transistor Tr3 is provided in the circuit, the circuit is enabled to actuate in such a manner that even if the word line WL2 is selected, the electric charge from the capacitor C1 cannot be read out in the bit line BL1.

According to the aforementioned first embodiment, the channel region of the vertical transistor is formed of the epitaxially grown monocrystalline silicon layer 18. Therefore, the manufacturing process of the first embodiment can be easily incorporated into the DRAM process employing the conventional stacked capacitor, and at the same time, it becomes possible to suppress the manufacturing cost thereof.

Further, the top surface of the insulating film 22 is made flush with the top surface of the n-type diffusion region 23, thereby forming a flat surface free from any stepped portion. Therefore, since the storage node contacts 29a and 29b can be formed on a flattened surface, the formation of the contacts can be facilitated.

Additionally, since the vertical cell transfer transistor is employed, the gate length can be increased larger than the minimum design rule. Accordingly, since the deterioration in threshold value of the cell transfer transistor due to the short channel effect can be prevented, it is no longer necessary to increase the concentration of impurity of the channel region, and at the same time, the deterioration of pose characteristic can be also suppressed.

Incidentally, the formation of the monocrystalline silicon layer 18 may be executed in such a way that silicon is allowed to epitaxially grow without incorporating an impurity thereinto, and the ion implantation of impurity is performed after the epitaxial growth of silicon has been accomplished.

Further, the gate insulating film 20 may be formed by means of CVD method. On this occasion, the gate insulating film may be formed by making use of a film of high-melting point metal oxide such as tantalum oxide, hafnium oxide, zirconium oxide, etc.

With regard to the method of introducing an impurity in the formation of the n-type diffusion region 23, the dummy layer 15 may be formed at first by making use of a laminate structure consisting of a nitride film and a PSG (Phosphorous Silicate Glass) film or an AsSG (Arsenic Silicate Glass) film, and then, an impurity (phosphorus or arsenic) is allowed to diffuse from the PSG film into the region 23 in a heat treatment before the dummy layer 15 is peeled away.

A Second Embodiment

This second embodiment is featured in that the vertical cell transfer transistor of the aforementioned first embodiment is employed, and that the element region is disposed obliquely relative to the bit line.

Figure 15A:
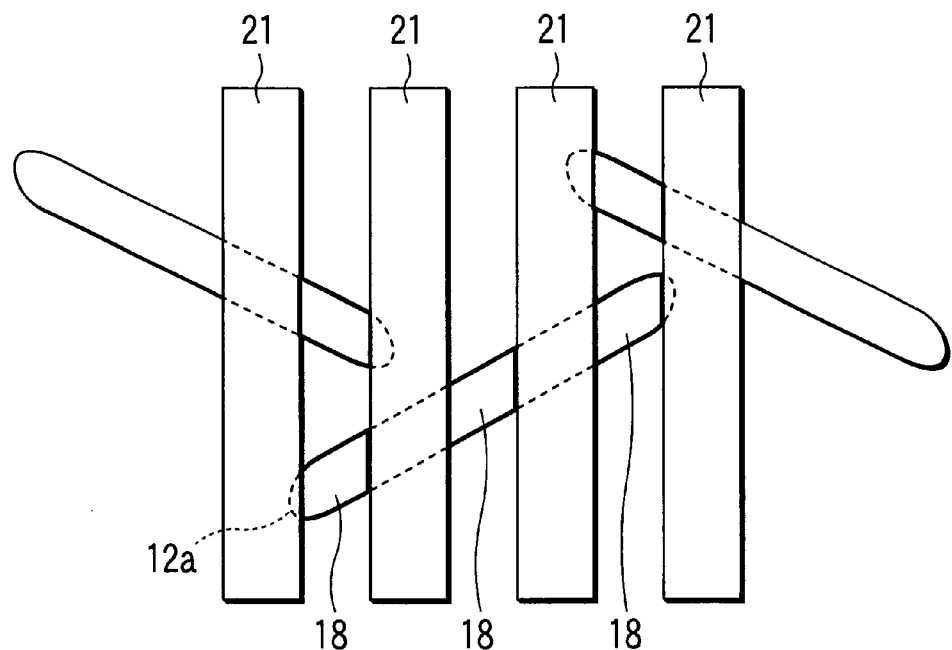
FIGS. 15A and 15B are plan views of the semiconductor memory according to a second embodiment of this invention.
Figure 15B:
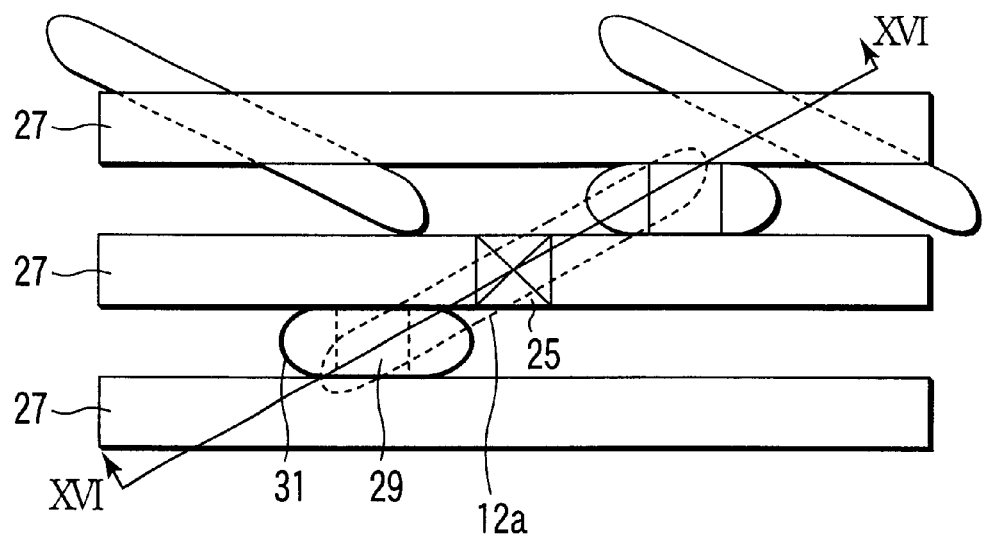

FIGS. 15A and 15B are plan views of the semiconductor memory according to this second embodiment. More specifically, FIG. 15A shows the positional relationship among an element region 12a, a word line 21 and a monocrystalline silicon layer 18. Whereas, FIG. 15B shows the positional relationship among the element region 12a, a bit line contact 25, a bit line 27, a storage node contact 29 and storage node 31. Incidentally, the word line 21 is omitted in FIG. 15B.

As shown in FIGS. 15A and 15B, the element region 12a is formed in such a manner that it is not perpendicular to the word line 21, and also is not parallel with the bit line 27. As a result, since the bit line contact 25 can be disposed over the element region 12a, it is no longer required to provide such a bit line lead-out portion (polycrystalline silicon layer 18c) as shown in the first embodiment.

FIG. 16A shows a cross-sectional view of the semiconductor memory taken along the line XVI—XVI of FIG. 15B. Next, the manufacturing method of a semiconductor memory according to the second embodiment will be explained. Incidentally, in the following explanation, the explanation of the same steps as those of the first embodiment will be omitted.

Figure 16:
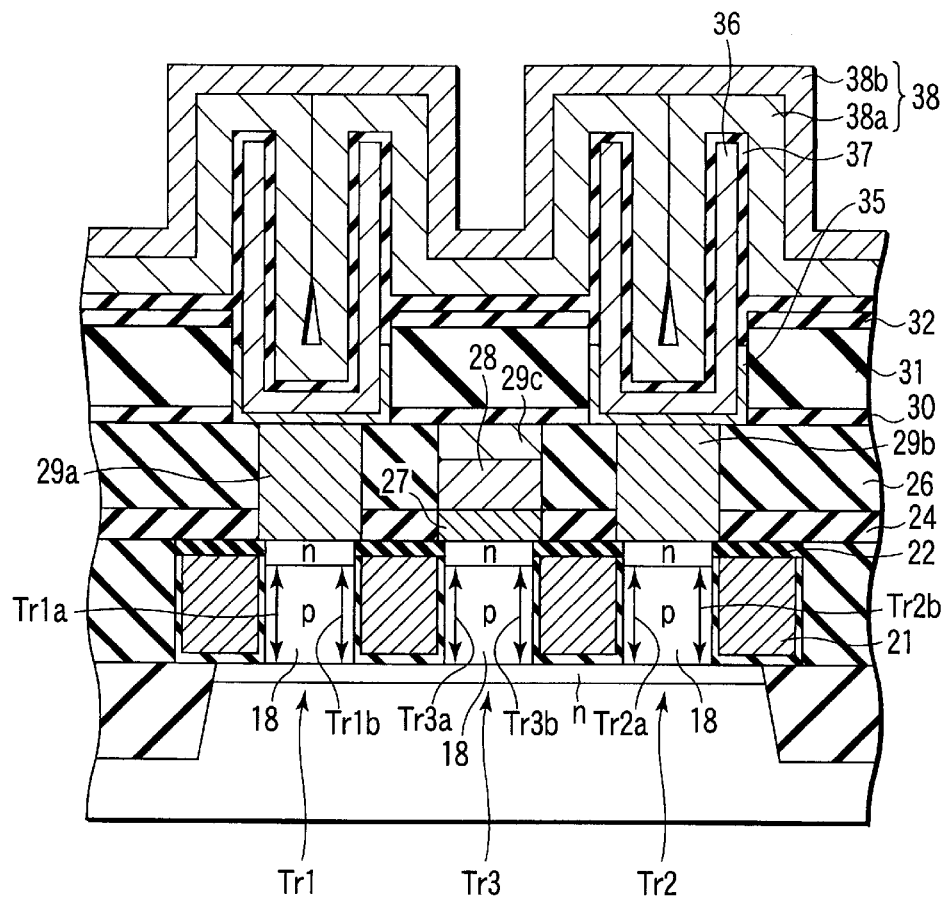
FIG. 16 is a cross-sectional view taken along the line XVI—XVI of FIG. 15 representing the semiconductor memory according to a second embodiment of this invention.

As shown in FIGS. 1 to 3, as in the case the first embodiment, a monocrystalline silicon layer 18 is formed in the first recessed portion 16a by way of epitaxial growth and subsequently flattened. In this case, since the bit line lead-out portion is not required to be formed, only the selective epitaxial growth is required in the formation of the channel region of the vertical transistor, and hence the aforementioned non-selective deposition of silicon is not performed at all. Then, as shown in FIG. 4, as in the case the first embodiment, the word line 21 is formed. Since the subsequent steps thereafter are the same as those of the first embodiment, the explanation of these subsequent steps will be omitted. Ultimately, a semiconductor memory according to the second embodiment is obtained as shown in FIG. 16.

According to the aforementioned second embodiment, the same effects as obtained in the first embodiment can be obtained.

Since the element region 12a is obliquely disposed relative to the bit line 27 in the cell where the vertical cell transfer transistor of the first embodiment is employed, it is possible to prevent the storage node contact 31 from being superimposed on the bit line 27. Therefore, since it is no longer required to form the bit line lead-out portion over the STI 12b, the steps of forming the vertical cell transfer transistor will be confined only to selective epitaxial growth, thereby making it possible to further simplify the manufacturing process thereof as compared with that of the first embodiment.

A Third Embodiment

This third embodiment is featured in that the vertical cell transfer transistor of the aforementioned first embodiment is employed, and that the distance between neighboring STIs is made smaller than that of the first embodiment, so that the STI is disposed immediately below the channel region of the vertical transistor which neighbors on the passing word line.

Figure 17:
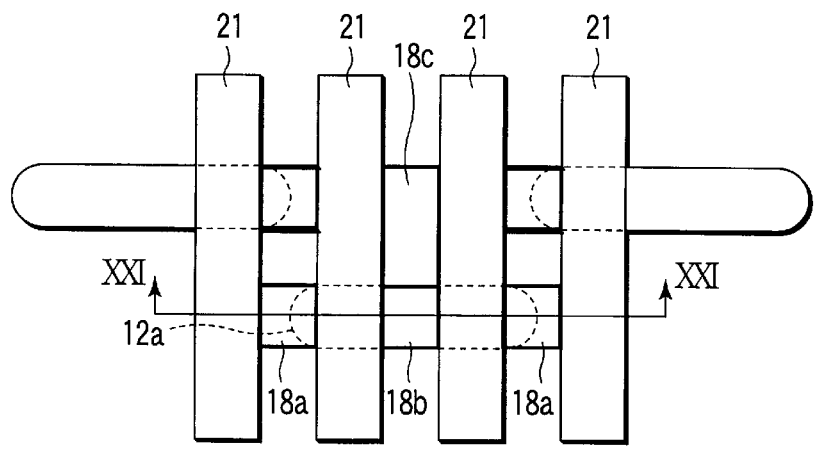
FIG. 17 shows a plan view of the semiconductor memory according to a third embodiment of this invention.

FIG. 17 shows a plan view of the semiconductor memory according to this third embodiment. More specifically, FIG. 17 shows the positional relationship among an element region 12a, a word line 21, monocrystalline silicon layers 18a and 18b and a polycrystalline silicon layer 18c. As shown in FIG. 17, the element region 12a is formed so as to partially overlap with the p-type monocrystalline silicon layer 18a. Incidentally, in this third embodiment, the positional relationship among the element region 12a, a bit line contact 25, a bit line 27, a storage node contact 29 and storage node 31 is the same as that of the first embodiment shown in FIG. 1B.

FIG. 18 through FIG. 21 show cross-sectional views of the semiconductor memory taken along the line XXI—XXI of FIG. 17 and illustrate the manufacturing steps thereof.

Next, the manufacturing method of a semiconductor memory according to the third embodiment will be explained. Incidentally, in the following explanation on this third embodiment, the explanation of the same steps as those of the first embodiment will be omitted.

First of all, as shown in FIG. 18, an STI 12b is selectively formed inside the semiconductor substrate 11, and a sacrificial oxide film 13 is formed on the surface of the semiconductor substrate 11. Then, an n-type diffusion region 14 is formed on the surface of the element region 12a of the semiconductor substrate 11.

Thereafter, a dummy layer 15 formed of a nitride film is formed on the surface of the sacrificial oxide film 13 and then, selectively etched. As a result, a first recessed portion 16a, a second recessed portion 16b and a third recessed portion 16c exposing the surfaces of element region 12a and STI 12b are formed. In this case, the first recessed portion 16a is formed over the element region 12a, the second recessed portion 16b is formed over the STI 12b, and the third recessed portion 16c is formed over a boundary portion between the element region 12a and the STI 12b. As a result, an end portion of the n-type diffusion region 14 is disposed so as to overlap with a portion of the p-type monocrystalline silicon layer 18a.

Thereafter, an interlayer insulating film 17 formed of BPSG for instance is formed over the dummy layer 15 and in the first, second and third recessed portions 16a, 16b and 16c, thereby filling these recessed portions 16a, 16b and 16c with this interlayer insulating film 17. Then, by means of CMP, this interlayer insulating film 17 is flattened until the surface of the dummy layer 15 is exposed.

Then, as shown in FIG. 19, by making use of lithographic technique and etching technique, the interlayer insulating film 17 formed inside the first and third recessed portions 16a and 16c is etched away to expose the surface of the element region 12a. Thereafter, silicon which is free from impurities is allowed to epitaxially grow up from the exposed surface of the element region 12a, thereby forming a monocrystalline silicon layer 18 in the first and third recessed portions 16a and 16c. The epitaxial growth on this occasion should be executed so as to allow the monocrystalline silicon layer 18 to be formed selectively only on the silicon substrate. At the moment when the height of the monocrystalline silicon layer 18 becomes higher than the level of the surface of the dummy layer 15, the crystal growth is switched from the aforementioned selective growth to a non-selective growth, thereby allowing polycrystalline silicon layer (not shown) to be deposited also on the interlayer insulating film 17. Thereafter, by means of CMP, the flattening of the monocrystalline silicon layer 18 and of the polycrystalline silicon layer is performed until the surface of the dummy layer 15 is exposed.

As a result of these procedures described above, the monocrystalline silicon layer 18 is enabled to be formed only inside the first and third recessed portions 16a and 16c formed on the element region 12a. Further, as shown in FIG. 17, the polycrystalline silicon layer 18c is left remained over part of the STI 12b. This polycrystalline silicon layer 18c left remained in this manner is utilized subsequently as a bit line lead-out portion for connecting a bit line contact with the cell transfer transistor as described hereinafter.

Next, as shown in FIG. 20, by making use of hydrofluoric acid and glycerol, the dummy layer 15 is removed to thereby form a groove 19. The sidewall of the monocrystalline silicon layer 18 and the top surface of the element region 12a that have been exposed due to the formation of this groove 19 are oxidized, thereby enabling a gate insulating film 20 to be formed on the sidewall and bottom face of the groove 19. Thereafter, the groove 19 is filled with a gate electrode material, e.g. a metallic material 21a such as polycrystalline silicon or tungsten. Then, the metallic material 21a is flattened by means of CMP until the surface of the monocrystalline silicon layer 18 is exposed, thereby forming the word line 21 in the groove 19. In this case, the word line 21 formed over the STI 12b can be used as a passing word line, while the word line 21 formed over the element region 12a can be used as an active word line.

Further, by making use of a photoresist (not shown) as a mask, the ion implantation of impurities is performed in such a manner that the monocrystalline silicon layer 18 disposed inside the third recessed portion 16c is turned into a p-type region, while the monocrystalline silicon layer 18 disposed inside the first recessed portion 16a is turned into an n-type region. As a result, a p-type monocrystalline silicon layer 18a to be utilized as a channel region of transistor as well as an n-type monocrystalline silicon layer 18b to be utilized as a bit line contact portion are produced.

Then, as shown in FIG. 21, by way of a recessing treatment employing RIE, only an upper surface portion of the word line 21 is removed. Thereafter, an insulating film 22 constituted by an oxide film or a nitride film, for example TEOS, is formed on the surface of the word line 21 whose upper surface portion has been etched away as well as on the surface of the monocrystalline silicon layers 18a and 18b. Subsequently, the flattening of the insulating film 22 is performed by means of CMP. As a result, the insulating film 22 is left remained only on an upper surface portion of the word line 21.

Next, an impurity element such as phosphorus or arsenic is ion-implanted into the p-type and n-type monocrystalline silicon layers 18a and 18b so as to turn the surface portions thereof into an n-type region, thereby forming an n-type diffusion region 23 which is designed to be utilized as a drain of cell transfer transistor. In this case, it is desirable to form the n-type diffusion region 23 in such a manner that it extends deeper than the bottom face of the insulating film 22. Further, the top surface of the insulating film 22 is made flush with the top surface of the n-type diffusion region 23, thereby forming a flat surface free from any stepped portion.

In this manner, vertical cell transfer transistors Tr1, and Tr2 can be formed, each transistor comprising a channel region constituted by the monocrystalline silicon layer 18a, source-drain regions constituted by n-type diffusion regions 14 and 23 which are formed over and below the monocrystalline silicon layer 18a, and an embedded type gate electrode constituted by the word line 21.

Next, as shown in FIGS. 22A and 22B, in the same manner as in the case of the first embodiment, a bit line contact 25, a bit line 27, storage node contacts 29a and 29b, and the capacitors C1 and C2 are formed.

Incidentally, since the equivalent circuit of this third embodiment is the same as that of the ordinary DRAM cell, the equivalent circuit is omitted herein.

It is possible according to this third embodiment to obtain almost the same effects as obtainable in the aforementioned first embodiment.

Furthermore, the distance between neighboring element regions is made larger than that of the first embodiment, so that the STI is disposed immediately below the channel region (p-type monocrystalline silicon layer 18a) of the vertical transistor which neighbors on the passing word line. Therefore, even if the passing word line is happened to be selected, a read-out rout for the electric charge of the transistor Tr1 would not be produced. Accordingly, it is no longer necessary to form a transistor immediately below the bit line contact 25, thereby making it possible to minimize the resistivity of the element.

Incidentally, this third embodiment is also applicable, as in the case of the second embodiment, to a situation where the element region is disposed obliquely relative to the bit line.

A Fourth Embodiment

This fourth embodiment is featured in that the vertical cell transfer transistor of the aforementioned first embodiment is employed, and that p-type and n-type diffusion regions are formed on the surface of the element region.

FIGS. 23A and 23B respectively shows a plan view of the semiconductor memory according to this fourth embodiment. More specifically, FIG. 23A shows the positional relationship among an element region 12a (n-type diffusion region 14a and p-type diffusion region 14b), an STI 12b, a word line 21, monocrystalline silicon layers 18a and 18b, and a polycrystalline silicon layer 18c. Whereas, FIG. 23B shows the positional relationship among the element region 12a, a bit line contact 25, a bit line 27, a storage node contact 29 and storage node 31. Incidentally, the word line 21 is omitted in FIG. 23B.

FIG. 24 through FIG. 27 respectively shows a cross-sectional view of a semiconductor memory taken along the line X—X of FIG. 23A. More specifically, FIG. 28A shows a cross-sectional view of the semiconductor memory taken along the line XXVIIIA—XXVIIIA of FIG. 23B. Whereas, FIG. 28B shows a cross-sectional view of the semiconductor memory taken along the line XXVIIIB—XXVIIIB of FIG. 23B. Next, the manufacturing method of a semiconductor memory according to the fourth embodiment will be explained. Incidentally, in this fourth embodiment, the explanation on the same steps as those of the first embodiment is simplified.

Figure 24:
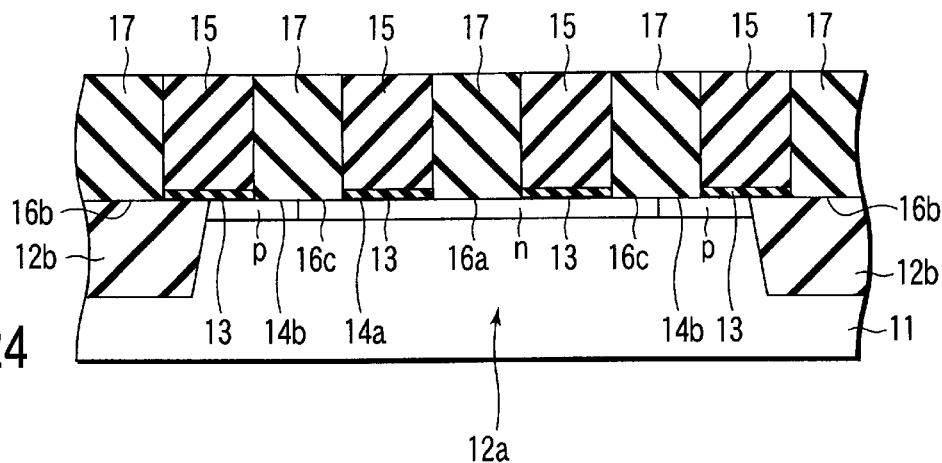

First of all, as shown in FIG. 24, the STI 12b is selectively formed in a semiconductor substrate 11, and the sacrificial oxide film 13 is formed on the semiconductor substrate 11. Next, a p-type diffusion region 14b is formed next to the STI 12b on the surface of the element region 12a, while an n-type diffusion region 14a is formed next to the p-type diffusion region 14b at the central portion of the element region 12a. Accordingly, an ion implantation is performed so as to turn the surface of the element region 12a into an n-type region.

Next, a dummy layer 15 made of a nitride film is formed on the sacrificial oxide film 13. Then, the dummy layer 15 is selectively etched. As a result, a first recessed portion 16a, a second recessed portion 16b and a third recessed portion 16c exposing the surfaces of element region 12a and STI 12b are formed. In this case, the first recessed portion 16a is formed over the element region 12a, the second recessed portion 16b is formed over the STI 12b, and the third recessed portion 16c is formed over a boundary portion between the element region 14a and 14b. As a result, an end portion of the n-type diffusion region 14 of the element region 12a is disposed so as to overlap with a portion of the word line 21 disposed next to an interlayer insulating film 17 to be explained hereinafter.

Thereafter, the interlayer insulating film 17 formed of BPSG for instance is formed over the dummy layer 15 and in the first, second and third recessed portions 16a, 16b and 16c, thereby filling these recessed portions 16a, 16b and 16c with this interlayer insulating film 17. Then, by means of CMP, this interlayer insulating film 17 is flattened until the surface of the dummy layer 15 is exposed.

Figure 25:
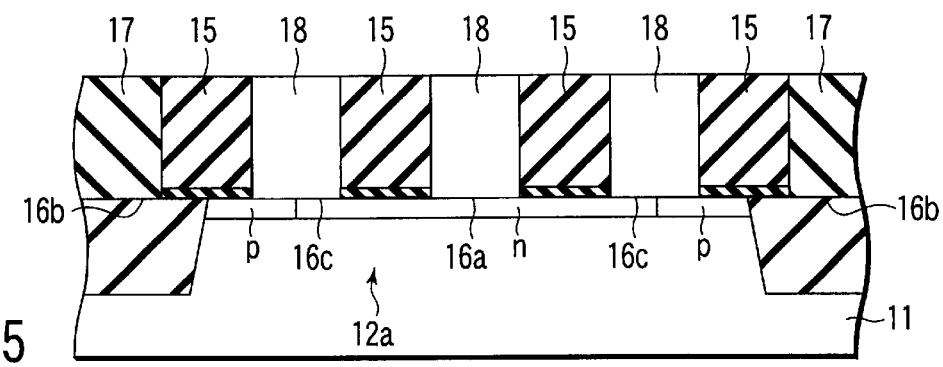

Then, as shown in FIG. 25, by making use of lithographic technique and etching technique, the interlayer insulating film 17 formed inside the first and third recessed portions 16a and 16c is etched away to expose the surface of the element region 12a. Thereafter, silicon which is free from impurities is allowed to epitaxially grow up from the exposed surface of the element region 12a, thereby forming a monocrystalline silicon layer 18 in the first and third recessed portions 16a and 16c. The epitaxial growth on this occasion should be executed so as to allow the monocrystalline silicon layer 18 to be formed selectively only on silicon substrate. At the moment when the height of the monocrystalline silicon layer 18 becomes higher than the level of the surface of the dummy layer 15, the crystal growth is switched from the aforementioned selective growth to a non-selective growth, thereby allowing polycrystalline silicon layer (not shown) to be deposited also on the interlayer insulating film 17. Thereafter, by means of CMP, the flattening of the monocrystalline silicon layer 18 and of the polycrystalline silicon layer is performed until the surface of the dummy layer 15 is exposed.

As a result, the monocrystalline silicon layer 18 is enabled to be formed only inside the first and third recessed portions 16a and 16c formed on the element region 12a. Further, as shown in FIG. 17, the polycrystalline silicon layer 18c is left remained over part of the STI 12b. This polycrystalline silicon layer 18c left remained in this manner is utilized subsequently as a bit line lead-out portion for connecting a bit line contact with the cell transfer transistor as described hereinafter.

Figure 26:
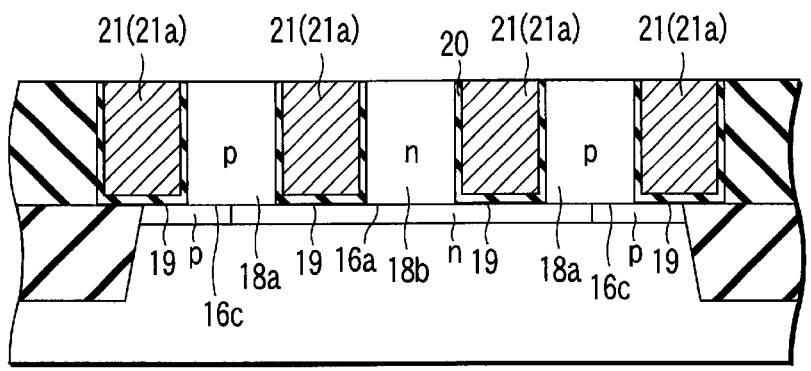

Next, as shown in FIG. 26, by making use of hydrofluoric acid and glycerol, the dummy layer 15 is removed to thereby form a groove 19. Then, the sidewall of the monocrystalline silicon layer 18 and the top surface of the element region 12a that have been exposed in this manner are oxidized, thereby enabling a gate insulating film 20 to be formed on the sidewall and bottom face of the groove 19. Thereafter, the groove 19 is filled with a gate electrode material, e.g. a metallic material 21a such as polycrystalline silicon or tungsten. Then, the metallic material 21a is flattened by means of CMP until the surface of the monocrystalline silicon layer 18 is exposed, thereby forming the word line 21 in the groove 19.

Further, by making use of a photoresist (not shown) as a mask, the ion implantation of impurities is performed in such a manner that the monocrystalline silicon layer 18 disposed inside the third recessed portion 16c is turned into a p-type region, while the monocrystalline silicon layer 18 disposed inside the first recessed portion 16a is turned into an n-type region. As a result, a p-type monocrystalline silicon layer 18a to be utilized as a channel region of transistor as well as an n-type monocrystalline silicon layer 18b to be utilized as a bit line contact portion are produced.

Figure 27:
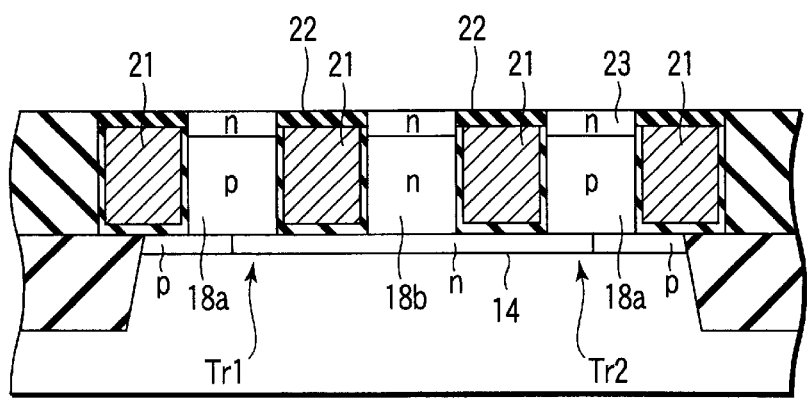

Then, as shown in FIG. 27, by way of a recessing treatment employing RIE, only an upper surface portion of the word line 21 is removed. Thereafter, an insulating film 22 constituted by an oxide film or a nitride film, for example TEOS, is formed on the surface of the word line 21 whose upper surface portion has been etched away as well as on the surface of the monocrystalline silicon layers 18a and 18b. Subsequently, the flattening of the insulating film 22 is performed by means of CMP. As a result, the insulating film 22 is left remained only on an upper surface portion of the word line 21.

Next, an impurity element such as phosphorus or arsenic is ion-implanted into the p-type and n-type monocrystalline silicon layers 18a and 18b so as to turn the surface portions thereof into an n-type region, thereby forming an n-type diffusion region 23 which is designed to be utilized as a drain of cell transfer transistor. In this case, it is desirable to form the n-type diffusion region 23 in such a manner that it extends deeper than the bottom face of the insulating film 22. Further, the top surface of the insulating film 22 is made flush with the top surface of the n-type diffusion region 23, thereby forming a flat surface free from any stepped portion.

In this manner, vertical cell transfer transistors Tr1, and Tr2 can be formed, each transistor comprising a channel region constituted by the monocrystalline silicon layer 18a, source-drain regions constituted by n-type diffusion regions 14 and 23 which are formed over and below the monocrystalline silicon layer 18a, and an embedded type gate electrode constituted by the word line 21.

Next, as shown in FIGS. 28A and 28B, in the same manner as in the case of the first embodiment, a bit line contact 25, a bit line 27, storage node contacts 29a and 29b, and the capacitors C1 and C2 are formed.

Incidentally, since the equivalent circuit of this fourth embodiment is the same as that of the ordinary DRAM cell, the equivalent circuit is omitted herein.

It is possible according to this fourth embodiment to obtain almost the same effects as obtainable in the aforementioned first and third embodiments.

As in the case of the second embodiment, this fourth embodiment is applicable to a situation where the element region is disposed obliquely relative to the bit line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory which comprises:
   an element isolation region constituted by an element isolating insulation film and selectively formed in a semiconductor substrate, thereby isolating an element region by said element isolation region;
   a first diffusion region of a first conductivity type, which is formed on a surface of said element region;
   a plurality of electrodes formed selectively on a surface of said semiconductor substrate;
   a gate insulating film formed on the side wall and bottom face of said electrodes;
   a monocrystalline silicon layer of a second conductivity type which is located between said electrodes, opposite sidewalls of said monocrystalline silicon layer being contacted with said gate insulating film, and a bottom face of said monocrystalline silicon layer being contacted with said first diffusion region;
   a second diffusion region of a first conductivity type, which is formed on a surface of said monoctystalline silicon layer, said second diffusion region continuously extending from one of each pair of adjacent ones of said electrodes to the other of said each pair; and
   an insulating film formed on said electrodes, a top surface of said insulating film being flush with a top surface of said second diffusion region.

2. The semiconductor memory according to claim 1, wherein the bottom face of said second diffusion region is disposed at a place which is lower than the bottom face of said insulating film.

3. The semiconductor memory according to claim 1, which further comprises:
   a storage node contact connected electrically with said second diffusion region;
   a capacitor connected electrically with said storage node contact;
   a bit line contact connected electrically with a portion of said second diffusion region other than the portion thereof which is electrically connected with said storage node contact; and
   a bit line connected electrically with said bit line contact.

4. The semiconductor memory according to claim 3, wherein said element region is disposed obliquely to said bit line.

5. A semiconductor memory which comprises:
   an element isolation region constituted by an element isolating insulation film and selectively formed in a semiconductor substrate, thereby isolating an element region by said element isolation region;
   a first diffusion region of a first conductivity type, which is formed on a surface of said element region;
   a plurality of electrodes formed selectively on a surface of said semiconductor substrate;
   a gate insulating film formed on the side wall and bottom face of said electrodes;
   a first monocrystalline silicon layer of a first conductivity type which is located between said electrodes, opposite sidewalls of said first monocrystalline silicon layer being contacted with said gate insulating film, and a bottom face of said first monocrystalline silicon layer being contacted with said first diffusion region;
   a second monocrystalline silicon layer of a second conductivity type which is located between said electrodes, opposite sidewalls of said second monocrystalline silicon layer being contacted with said gate insulating film, and a bottom face of said second monocrystalline silicon layer being contacted with said first diffusion region and with said element isolation region;
   a second diffusion region of a first conductivity type, which is formed on a surface of each of said first and second monocrystalline silicon layers, said second diffusion region continuously extending from one of each pair of adjacent ones of said electrodes to the other of said each pair; and
   an insulating film formed on said electrodes, a top surface of said insulating film being flush with top surface of said second diffusion region.

6. The semiconductor memory according to claim 5, wherein the bottom face of said second diffusion region is disposed at a place which is lower than the bottom face of said insulating film.

7. The semiconductor memory according to claims 5, which further comprises:
   a storage node contact connected electrically with said second diffusion region formed on the surface of said second monocrystalline silicon layer;
   a capacitor connected electrically with said storage node contact;
   a bit line contact connected electrically with said second diffusion region formed on the surface of said first monocrystalline silicon layer; and
   a bit line connected electrically with said bit line contact.

8. The semiconductor memory according to claim 7, wherein said element region is disposed obliquely to said bit line.

9. A semiconductor memory which comprises:

an element isolation region constituted by an element isolating insulation film and selectively formed in a semiconductor substrate, thereby isolating an element region by said element isolation region;

a first diffusion region of a first conductivity type, which is formed on a surface of said element region;

a third diffusion region of a second conductivity type, which is formed on a surface of said element region, said third diffusion region being contacted with said first diffusion region and with said element isolation region;

a plurality of electrodes formed selectively on a surface of said semiconductor substrate;

a gate insulating film formed on the side wall and bottom face of said electrodes;

a first monocrystalline silicon layer of a first conductivity type which is located between said electrodes, opposite sidewalls of said first monocrystalline silicon layer being contacted with said gate insulating film, and a bottom face of said first monocrystalline silicon layer being contacted with said first diffusion region;

a second monocrystalline silicon layer of a second conductivity type which is located between said electrodes, opposite sidewalls of said second monocrystalline silicon layer being contacted with said gate insulating film, and a bottom face of said second monocrystalline silicon layer being contacted with said first diffusion region and with said third diffusion region;

a second diffusion region of a first conductivity type, which is formed on a surface of each of said first and second monocrystalline silicon layers, said second diffusion region continuously extending from one of each pair of adjacent ones of said electrodes to the other of said each pair; and an insulating film formed on said electrodes, a top surface of said insulating film being flush with a top surface of said second diffusion region.

10. The semiconductor memory according to claim 9, wherein the bottom face of said second diffusion region is disposed at a place which is lower than the bottom face of said insulating film.

11. The semiconductor memory according to claim 9, which further comprises:

a storage node contact connected electrically with said second diffusion region formed on the surface of said second monocrystalline silicon layer;

a capacitor connected electrically with said storage node contact;

a bit line contact connected electrically with said second diffusion region formed on the surface of said first monocrystalline silicon layer; and a bit line connected electrically with said bit line contact.

12. The semiconductor memory according to claim 11, wherein said element region is disposed obliquely to said bit line.

* * * * *

UNITED STATES PATENT AND TRADEMARK OFFICE
CERTIFICATE OF CORRECTION

PATENT NO. : 6,696,713 B2
DATED : February 24, 2004
INVENTOR(S) : Shigeru Ishibashi It is certified that error appears in the above-identified patent and that said Letters Patent is hereby corrected as shown below:

<u>Title page,</u>
Item [56], References Cited, U.S PATENT DOCUMENTS, please insert the following references:
-- 6,198,151 B1   03/2001   Wada
   6,150,687     11/2000   Noble et al.
   6,204,532 N1  03/2001   Gambino
   5,959,319     09/1999   Iwasa --

Signed and Sealed this

Fifth Day of October, 2004

JON W. DUDAS
*Director of the United States Patent and Trademark Office*